US012784811B2

(12) United States Patent
Kim et al.

(10) Patent No.: US 12,784,811 B2
(45) Date of Patent: Nov. 3, 2026

(54) SENSE AMPLIFIER CIRCUIT HAVING BITLINE SENSE AMPLIFERS AND EQUALIZING CIRCUIT AND SEMICONDUCTOR MEMORY DEVICE INCLUDING THE SAME

(71) Applicant: SAMSUNG ELECTRONICS CO., LTD, Suwon-si (KR)

(72) Inventors: Kyoungmin Kim, Suwon-si (KR); Donggeon Kim, Suwon-si (KR); Myeongsik Ryu, Suwon-si (KR); Sujin Park, Suwon-si (KR); Inseok Baek, Suwon-si (KR); Bokyeon Won, Suwon-si (KR); Jongmoon Yoon, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 77 days.

(21) Appl. No.: 18/774,324

(22) Filed: Jul. 16, 2024

(65) Prior Publication Data

US 2025/0210096 A1 Jun. 26, 2025

(30) Foreign Application Priority Data

Dec. 13, 2023 (KR) ........................ 10-2023-0180297

(51) Int. Cl.
*G11C 11/4091* (2006.01)
*H10B 12/00* (2023.01)
(Continued)

(52) U.S. Cl.
CPC .......... *G11C 11/4091* (2013.01); *H10B 12/50* (2023.02); *G11C 7/065* (2013.01);
(Continued)

(58) Field of Classification Search
CPC ......... G11C 11/4091; G11C 7/12; G11C 7/06; G11C 11/4094; G11C 11/4097;
(Continued)

(56) References Cited

U.S. PATENT DOCUMENTS 6,765,833 B2 7/2004 Khang
7,511,982 B2 * 3/2009 Kurjanowicz ......... G11C 17/18 365/96
(Continued)

FOREIGN PATENT DOCUMENTS

JP 2000-138355 5/2000
JP 2014-139995 7/2014
KR 10-0379550 B1 4/2003

*Primary Examiner* — B. James Peikari
(74) *Attorney, Agent, or Firm* — Morgan, Lewis & Bockius LLP

(57) ABSTRACT

A sense amplifier circuit including bitline sense amplifiers each of which includes an amplifying circuit, an isolation circuit, an offset cancellation circuit, and an equalizer circuit. The amplifying circuit is connected to a bitline and a complementary bitline to adjust a voltage of a sensing bitline and a complementary sensing bitline. The isolation circuit connects the bitline and the complementary bitline to the complementary sensing bitline and the sensing bitline. The offset cancellation circuit connects the bitline and the complementary bitline to the sensing bitline and the complementary sensing bitline. The equalizer circuit equalizes the bitline and the complementary bitline to a precharge voltage, and includes an equalizing transistor. An active region is formed such that sources of equalizing transistors of first and second bitline sense amplifiers are connected and sources of equalizing transistors of first and third bitline sense amplifiers are separated.

17 Claims, 23 Drawing Sheets

(51) Int. Cl.
*G11C 7/06* (2006.01)
*G11C 7/12* (2006.01)
*G11C 11/4063* (2006.01)
*G11C 11/4094* (2006.01)
*G11C 11/4097* (2006.01)

(52) U.S. Cl.
CPC ............ *G11C 7/12* (2013.01); *G11C 11/4063* (2013.01); *G11C 11/4094* (2013.01); *G11C 11/4097* (2013.01); *G11C 2207/12* (2013.01); *H10B 12/482* (2023.02)

(58) Field of Classification Search
CPC . G11C 2207/12; G11C 11/4063; G11C 7/065; H10B 12/482; H10B 12/50
See application file for complete search history.

(56) References Cited

U.S. PATENT DOCUMENTS

| | | | | |
|---|---|---|---|---|
| 8,750,063 | B2 | 6/2014 | Choi | |
| 9,202,531 | B2 * | 12/2015 | Seo | G11C 7/065 |
| 9,286,949 | B2 | 3/2016 | Takahashi | |
| 9,318,169 | B2 | 4/2016 | Won et al. | |
| 10,224,093 | B2 * | 3/2019 | Kim | G11C 11/4091 |
| 11,024,365 | B1 * | 6/2021 | Seo | G11C 11/4091 |
| 2023/0071414 | A1 * | 3/2023 | Chi | G11C 7/06 |
| 2023/0230630 | A1 * | 7/2023 | Yang | H10B 12/50 365/149 |

* cited by examiner

110b

[Precharging Operation, S110]

[Offset Cancelling Operation, S120]

[Charge Sharing Operation, S130]

[Pre-Sensing Operation, S140]

SENSE AMPLIFIER CIRCUIT HAVING BITLINE SENSE AMPLIFERS AND EQUALIZING CIRCUIT AND SEMICONDUCTOR MEMORY DEVICE INCLUDING THE SAME

CROSS-REFERENCE TO RELATED APPLICATION

This application claims priority under 35 USC § 119 to Korean Patent Application No. 10-2023-0180297 filed on Dec. 13, 2023 in the Korean Intellectual Property Office (KIPO), the contents of which are incorporated by reference herein in their entirety.

BACKGROUND

1. Technical Field

Example embodiments relate generally to semiconductor integrated circuits, and more particularly to sense amplifier circuits of semiconductor memory devices, and semiconductor memory devices including the same.

2. Description of the Related Art

Semiconductor memory devices may be divided into two categories depending upon whether or not they retain stored data when disconnected from a power supply. These fall into two categories: nonvolatile memory devices, which keep their stored data even after being disconnected from the power source, and volatile memory devices, which lose their recorded data. Volatile memory devices can read and write data quickly, but when they shut down, the data they contain could be gone. Nonvolatile memory devices can be used to store data that needs to be kept around since the contents are retained even after the device is powered down.

Semiconductor memory devices may include a plurality of memory cells. It may be necessary to precharge bitlines and complimentary bitlines to a precharge voltage, carry out a charge sharing operation, and observe variations in the bitlines' and complementary bitlines' voltage levels in order to identify data contained in the memory cells. Sense amplifiers then may receive and amplify the voltage differences between the bitlines and the complementary bitlines to detect the data stored in the memory cells.

SUMMARY

At least one example embodiment of the present disclosure provides a sense amplifier circuit capable of efficiently preventing defect and reducing size.

At least one example embodiment of the present disclosure provides a semiconductor memory device including the sense amplifier circuit.

According to example embodiments, a sense amplifier circuit includes a plurality of bitline sense amplifiers. Each of the plurality of bitline sense amplifiers includes an amplifying circuit, an isolation circuit, an offset cancellation circuit and an equalizer circuit. The amplifying circuit is electrically connected to a bitline and a complementary bitline, senses a voltage difference between the bitline and the complementary bitline, and adjusts a voltage of a sensing bitline and a complementary sensing bitline based on the voltage difference. The isolation circuit electrically connects the bitline and the complementary bitline with the complementary sensing bitline and the sensing bitline, respectively. The offset cancellation circuit electrically connects the bitline and the complementary bitline to the sensing bitline and the complementary sensing bitline, respectively. The equalizer circuit equalizes the bitline and the complementary bitline to a precharge voltage. The equalizer circuit includes an equalizing transistor that has a source, a gate configured to receive an equalizing signal, and a drain. An active region is formed such that sources of equalizing transistors of a first bitline sense amplifier and a second bitline sense amplifier are connected to each other and sources of equalizing transistors of the first bitline sense amplifier and a third bitline sense amplifier are separated from each other.

According to example embodiments, a semiconductor memory device includes a memory cell array and a sense amplifier circuit. The memory cell array includes a plurality of memory cells. The sense amplifier circuit includes a plurality of bitline sense amplifiers connected to the plurality of memory cells. Each of the plurality of bitline sense amplifiers includes an amplifying circuit, an isolation circuit, an offset cancellation circuit and an equalizer circuit. The amplifying circuit is electrically connected to a bitline and a complementary bitline, senses a voltage difference between the bitline and the complementary bitline, and adjusts a voltage of a sensing bitline and a complementary sensing bitline based on the voltage difference. The isolation circuit electrically connects the bitline and the complementary bitline with the complementary sensing bitline and the sensing bitline, respectively. The offset cancellation circuit electrically connects the bitline and the complementary bitline to the sensing bitline and the complementary sensing bitline, respectively. The equalizer circuit equalizes the bitline and the complementary bitline to a precharge voltage. The equalizer circuit includes an equalizing transistor that has a source, a gate configured to receive an equalizing signal, and a drain. An active region is formed such that sources of equalizing transistors of a first bitline sense amplifier and a second bitline sense amplifier are connected to each other and sources of equalizing transistors of the first bitline sense amplifier and a third bitline sense amplifier are separated from each other.

According to example embodiments, a sense amplifier circuit includes a plurality of bitline sense amplifiers. Each of the plurality of bitline sense amplifiers includes an amplifying circuit, an isolation circuit, an offset cancellation circuit and an equalizer circuit. The amplifying circuit is electrically connected to a bitline and a complementary bitline, senses a voltage difference between the bitline and the complementary bitline based on a first control signal and a second control signal, and adjusts a voltage of a sensing bitline and a complementary sensing bitline based on the voltage difference. The isolation circuit electrically connects the bitline and the complementary bitline with the complementary sensing bitline and the sensing bitline, respectively, based on an isolation signal. The offset cancellation circuit electrically connects the bitline and the complementary bitline to the sensing bitline and the complementary sensing bitline, respectively, based on an offset cancellation signal. The equalizer circuit is electrically connected to the complementary sensing bitline, and equalizes the bitline and the complementary bitline to a precharge voltage. The equalizer circuit includes an equalizing transistor that has a source configured to receive the precharge voltage, a gate configured to receive an equalizing signal, and a drain electrically connected to the complementary sensing bitline. Sources of first and second equalizing transistors included in first and second bitline sense amplifiers that are adjacent to each other are connected to each other, and a first active region corresponding to the sources of the first and second equalizing transistors is integrally formed. Sources of third and fourth equalizing transistors included in the third and fourth bitline sense amplifiers that are adjacent to each other and spaced apart from the first and second bitline sense amplifiers are connected to each other, and a second active region corresponding to the sources of the third and fourth equalizing transistors is integrally formed. The sources of the first and second equalizing transistors and the sources of the third and fourth equalizing transistors are separated from each other, and an active cut region is formed between the first and second active regions to separate the first active region from the second active region.

In the sense amplifier circuit and the semiconductor memory device according to example embodiments, some of the sources of the equalizing transistors included in the bitline sense amplifiers and the corresponding active regions may be separated. For example, the sources of the equalizing transistors included in the same bitline sense amplifier group may be electrically connected to each other, and the sources of the equalizing transistors included in the different bitline sense amplifier groups may be electrically separated from each other. According to structures, arrangements, and features disclosed in the present disclosure including, but not limited to, bitline sense amplifier circuits, equalizing transistors, the corresponding active regions, defects or failures in the sense amplifier circuit may be prevented and a size of the sense amplifier circuit may be reduced, as compared with the conventional sense amplifier circuit.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
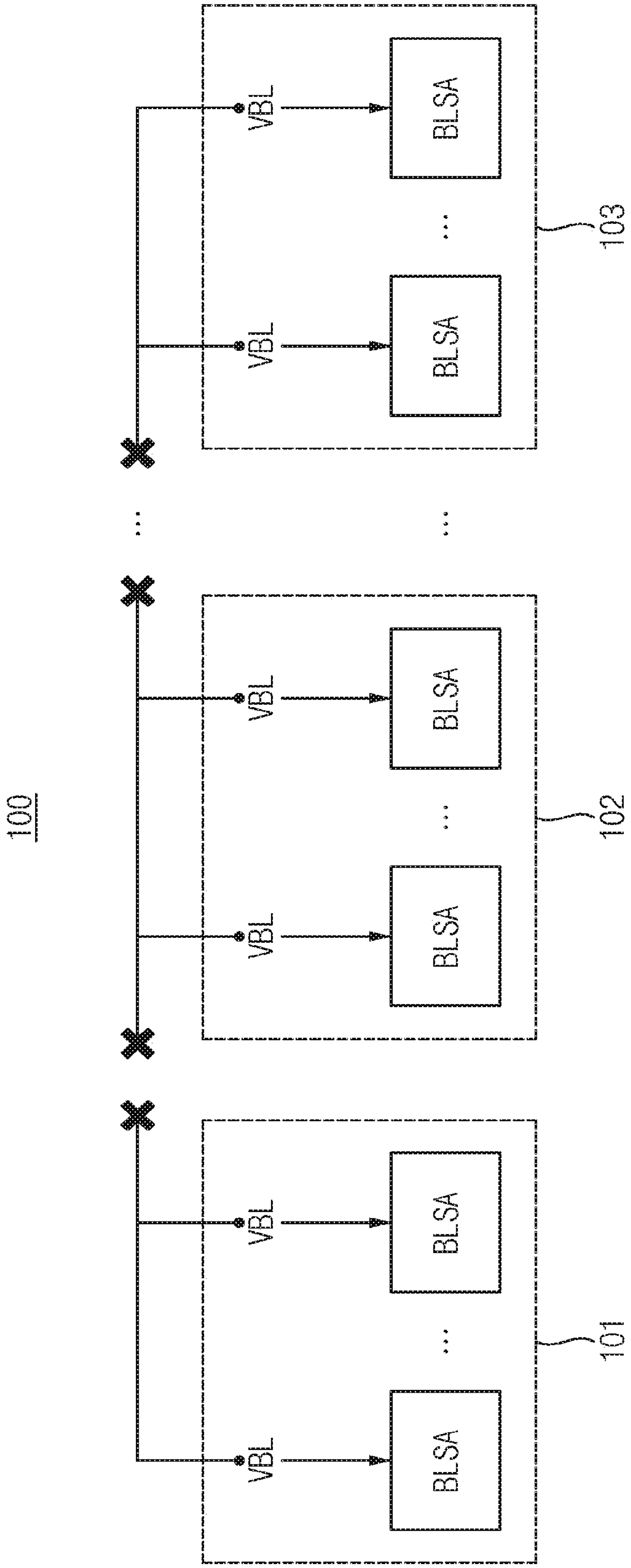
FIG. 1 is a block diagram illustrating a sense amplifier circuit according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a sense amplifier circuit according to example embodiments.

Referring to FIG. 1, a sense amplifier circuit 100 includes a plurality of bitline sense amplifiers BLSA.

In some example embodiments, as will be described with reference to FIG. 14, the sense amplifier circuit 100 may be included in a semiconductor memory device, and may perform an operation of sensing data stored in the semiconductor memory device.

Each of the plurality of bitline sense amplifiers BLSA may be connected to a bitline and a complementary bitline, and may include an amplifying circuit, an isolation circuit, an offset cancellation circuit and an equalizer circuit. A detailed circuit configuration of each bitline sense amplifier will be described with reference to FIGS. 3 and 7.

The plurality of bitline sense amplifiers BLSA may be divided or classified into a plurality of bitline sense amplifier groups 101, 102 and 103. For example, the first bitline sense amplifier group 101 may include two or more bitline sense amplifiers BLSA, the second bitline sense amplifier group 102 may include two or more bitline sense amplifiers BLSA, and the K-th bitline sense amplifier group 103 may include two or more bitline sense amplifiers BLSA, where K is a positive integer greater than or equal to two.

The plurality of bitline sense amplifiers BLSA may receive a precharge voltage VBL. For example, the precharge voltage VBL may be provided to the equalizer circuit. For example, as will be described with reference to FIGS. 3 and 7, the equalizer circuit may include an equalizing transistor, and the precharge voltage VBL may be applied to a source (or a source electrode or a first electrode) of the equalizing transistor.

In some example embodiments, sources of the equalizing transistors of bitline sense amplifiers BLSA may be entirely separated and partially connected each other. For example, sources of equalizing transistors included in bitline sense amplifiers in the same bitline sense amplifier group may be connected to each other, and sources of equalizing transistors included in bitline sense amplifiers in different bitline sense amplifier groups may be separated or isolated from each other.

For example, as illustrated in FIG. 1, sources of equalizing transistors included in the bitline sense amplifiers BLSA included in the first bitline sense amplifier group 101 are electrically connected to each other, sources of equalizing transistors included in the bitline sense amplifiers BLSA included in the second bitline sense amplifier group 102 are electrically connected to each other, and sources of equalizing transistors included in the bitline sense amplifiers BLSA included in the K-th bitline sense amplifier group 103 are electrically connected to each other. In addition, as illustrated by 'X' marks in FIG. 1, the sources of the equalizing transistors included in the bitline sense amplifiers BLSA included in the first bitline sense amplifier group 101 and the sources of the equalizing transistors included in the bitline sense amplifiers BLSA included in the second bitline sense amplifier group 102 are electrically separated from each other, and the sources of the equalizing transistors included in the bitline sense amplifiers BLSA included in the second bitline sense amplifier group 102 and the sources of the equalizing transistors included in the bitline sense amplifiers BLSA included in the K-th bitline sense amplifier group 103 are electrically separated from each other.

In other words, when the plurality of bitline sense amplifiers BLSA include a first bitline sense amplifier, a second bitline sense amplifier adjacent to the first bitline sense amplifier, and a third bitline sense amplifier adjacent to the second bitline sense amplifier, and when the first and second bitline sense amplifiers are included in the same bitline sense amplifier group and the first and third bitline sense amplifiers are included in different bitline sense amplifier groups, an active region may be formed such that sources of equalizing transistors of the first bitline sense amplifier and the second bitline sense amplifier are electrically connected to each other, and sources of equalizing transistors of the first bitline sense amplifier and the third bitline sense amplifier are electrically separated or isolated from each other because the first and the third bitline sense amplifiers are in a different bitline sense amplifier group.

In some example embodiments, as will be described with reference to FIGS. 4A, 4B and 4C, each of the plurality of bitline sense amplifiers BLSA may include an active region corresponding to the source of the equalizing transistor. For example, the feature that the sources of the equalizing transistors included in the bitline sense amplifiers included in the same bitline sense amplifier group are connected to each other may represent or indicate that active regions corresponding to the sources of the equalizing transistors included in the bitline sense amplifiers included in the same bitline sense amplifier group are connected to each other and formed integrally. For example, the feature that the sources of the equalizing transistors included in the bitline sense amplifiers included in the different bitline sense amplifier groups are separated from each other may represent or indicate that active regions corresponding to the sources of the equalizing transistors included in the bitline sense amplifiers included in the different bitline sense amplifier groups are separated from each other and an active cut region is formed between the active regions.

Figure 2:
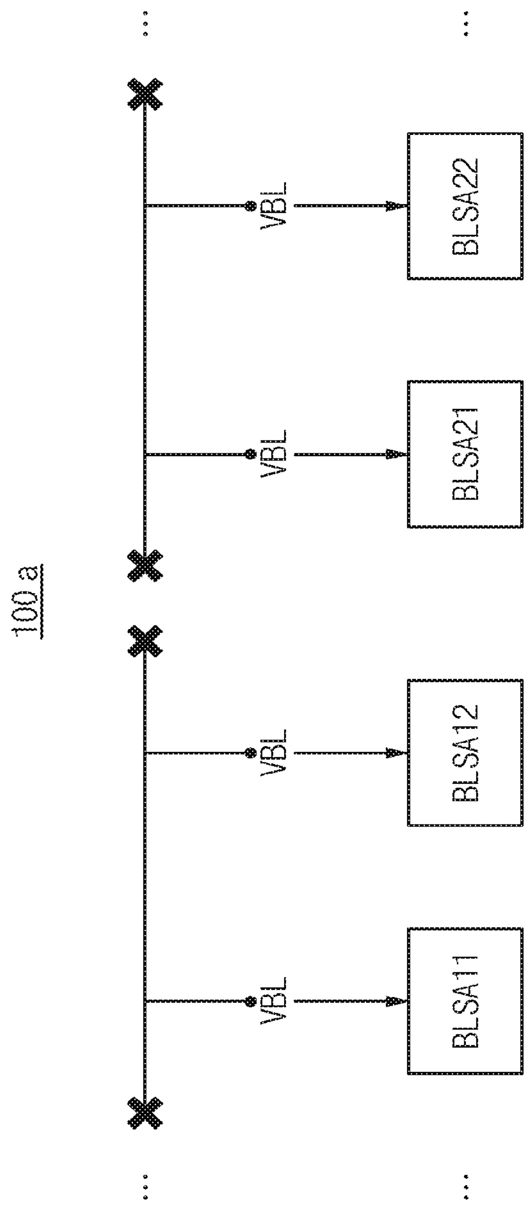
FIG. 2 is a block diagram illustrating an example of a sense amplifier circuit of FIG. 1.

FIG. 2 is a block diagram illustrating an example of a sense amplifier circuit of FIG. 1.

Referring to FIG. 2, a sense amplifier circuit 100*a* includes a first bitline sense amplifier BLSA11, a second bitline sense amplifier BLSA12, a third bitline sense amplifier BLSA21, and a fourth bitline sense amplifier BLSA22.

In an example of FIG. 2, the first and second bitline sense amplifiers BLSA11 and BLSA12 forms one bitline sense amplifier group, and the third and fourth bitline sense amplifiers BLSA21 and BLSA22 forms in another bitline sense amplifier group.

For example, the first and second bitline sense amplifiers BLSA11 and BLSA12, which are a pair of bitline sense amplifiers, may be disposed or arranged adjacent to each other, and may form or may be included in a first group of bitline sense amplifiers. For example, the third and fourth bitline sense amplifiers BLSA21 and BLSA22, which are another pair of bitline sense amplifiers, may be disposed or arranged adjacent to each other, may be spaced apart from the first and second bitline sense amplifiers BLSA11 and BLSA12, and may form or may be included in a second group of bitline sense amplifiers.

As described with reference to FIG. 1, sources of first equalizing transistors included in the first group of bitline sense amplifiers (e.g., included in the first and second bitline sense amplifiers BLSA11 and BLSA12) may be electrically connected to each other, and active regions corresponding to the sources of the first equalizing transistors may be integrally formed. Similarly, sources of second equalizing transistors included in the second group of bitline sense amplifiers (e.g., included in the third and fourth bitline sense amplifiers BLSA21 and BLSA22) may be electrically connected to each other, and active regions corresponding to the sources of the second equalizing transistors may be integrally formed. The sources of the first equalizing transistors and the sources of the second equalizing transistors may be electrically separated from each other, and the active regions corresponding to the sources of the first equalizing transistors and the active regions corresponding to the sources of the second equalizing transistors may be separated from each other.

Although FIG. 2 illustrates two bitline sense amplifier groups, example embodiments are not limited thereto, and the number of bitline sense amplifier groups may be variously determined according to example embodiments. In another example, the number of bitline sense amplifier groups may be one or three or more.

In a conventional sense amplifier circuit, sources of all equalizing transistors included in all bitline sense amplifiers were connected to each other.

In the sense amplifier circuit according to example embodiments, however, some of the sources of the equalizing transistors included in the bitline sense amplifiers and the corresponding active regions may be separated. For example, the plurality of bitline sense amplifiers may be divided into several bitline sense amplifier groups, the sources of the equalizing transistors included in the same bitline sense amplifier group may be electrically connected to each other, and the sources of the equalizing transistors included in the different bitline sense amplifier groups may be electrically separated from each other. Accordingly, defects or failures in the sense amplifier circuit may be prevented and a size of the sense amplifier circuit may be reduced, as compared with the conventional sense amplifier circuit in which the sources of all equalizing transistors are connected to each other.

Figure 3:
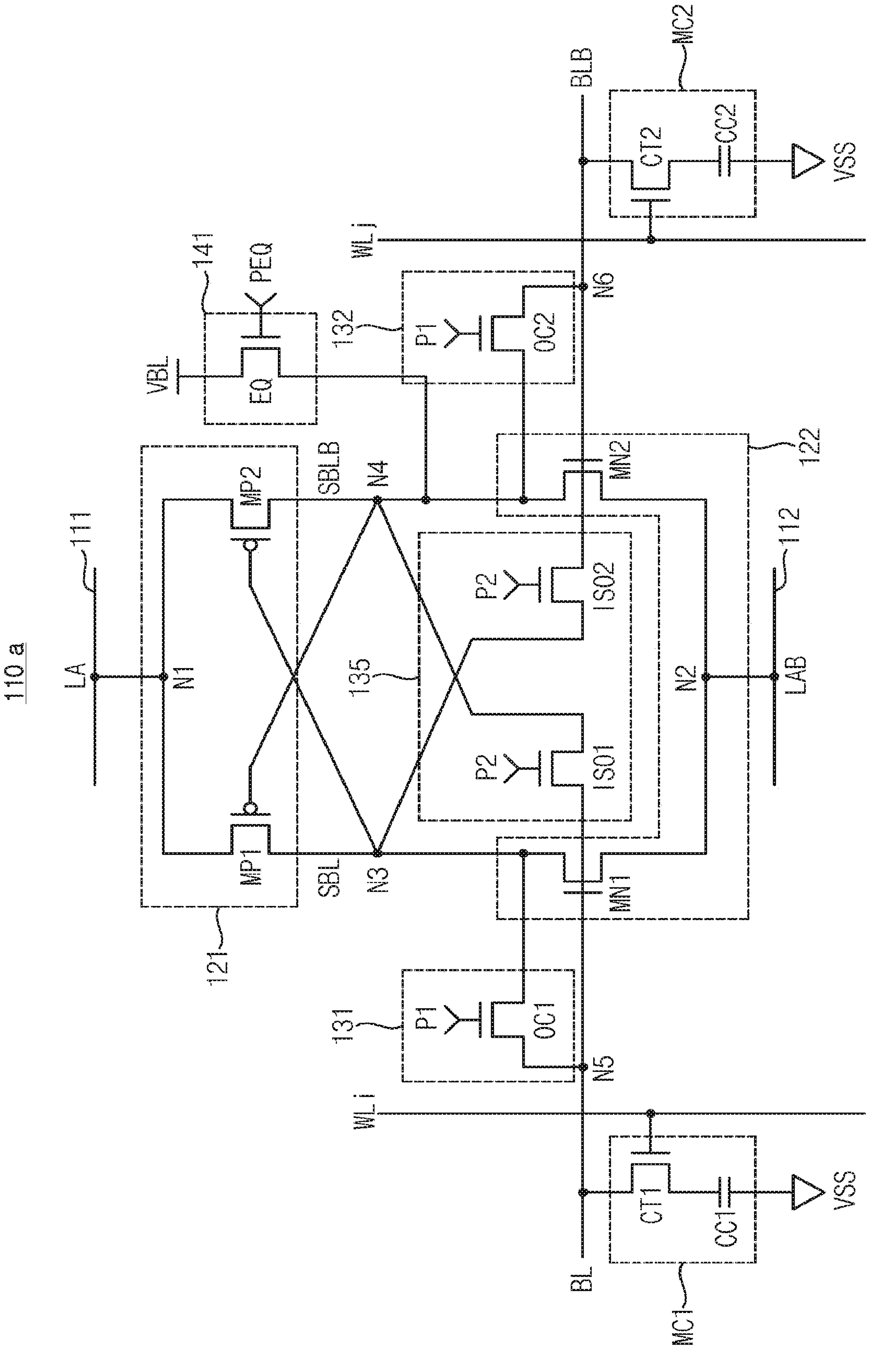
FIG. 3 is a circuit diagram illustrating an example of a bitline sense amplifier included in a sense amplifier circuit according to example embodiments.

FIG. 3 is a circuit diagram illustrating an example of a bitline sense amplifier included in a sense amplifier circuit according to example embodiments.

Referring to FIG. 3, a bitline sense amplifier 110*a* includes an amplifying circuit 121 and 122, an offset cancellation circuit 131 and 132, an isolation circuit 135, and an equalizer circuit 141. For example, the bitline sense amplifier 110*a* may be one of the plurality of bitline sense amplifiers BLSA in FIG. 1 and/or one of the bitline sense amplifiers BLSA11, BLSA12, BLSA21 and BLSA22 in FIG. 2.

In FIG. 3, the bitline sense amplifier 110*a*, a first memory cell MC1 and a second memory cell MC2 are illustrated for convenience of description.

The bitline sense amplifier 110*a* may be connected to a bitline BL and a complementary bitline BLB disposed opposite to the bitline BL, and may be connected to a control line 111 and a complementary control line 112 disposed opposite to the control line 111. The bitline sense amplifier 110*a* may be connected to a first memory cell MC1 through the bitline BL and a second memory cell MC2 through the complementary bitline BLB, respectively. For example, the bitline sense amplifier 110*a*, the first memory cell MC1 and the second memory cell MC2 may constitute a semiconductor memory device.

The first memory cell MC1 may include a cell transistor CT1 that is connected to a wordline WLi and the bitline BL, respectively and a cell capacitor CC1 connected to a ground voltage VSS. The second memory cell MC2 may include a cell transistor CT2 that is connected to a wordline WLj and the complementary bitline BLB, respectively, and a cell capacitor CC2 connected to the ground voltage VSS.

Each of the amplifying circuit 121 and 122 may be electrically connected to the bitline BL and the complementary bitline BLB, may sense a voltage difference between the bitline BL and the complementary bitline BLB based on a first control signal LA and a second control signal LAB, and may adjust a voltage of a sensing bitline SBL and a complementary sensing bitline SBLB based on the sensed voltage difference.

In some example embodiments, the amplifying circuit 121 and 122 may include a p-type amplifier 121 and an n-type amplifier 122. The p-type amplifier 121 may include a first p-type metal oxide semiconductor (PMOS) transistor MP1 and a second PMOS transistor MP2, and the n-type amplifier 122 may include a first n-type metal oxide semiconductor (NMOS) transistor MN1 and a second NMOS transistor MN2. However, in another example, the amplifying circuit 121 may be n-type amplifier, the amplifying circuit 122 may be p-type amplifier.

The first PMOS transistor MP1 may be connected between the control line 111 to which the first control signal LA is provided and the sensing bitline SBL (e.g., between a first node N1 and the sensing bitline SBL). In this case the first PMOS transistor MP1 may include a gate (or a gate electrode or a control electrode) connected to the complementary sensing bitline SBLB (or a fourth node N4). The second PMOS transistor MP1 may be connected between the control line 111 and the complementary sensing bitline SBLB. In this case, the second PMOS transistor MP2 may include a gate connected to the sensing bitline SBL (or a third node N3).

The first NMOS transistor MN1 may be connected between the complementary control line 112 to which the second control signal LAB is provided and the sensing bitline SBL (e.g., between a second node N2 and the sensing bitline SBL). In this case, the first NMOS transistor MN1 may include a gate connected to the bitline BL (or a fifth node N5). The second NMOS transistor MN2 may be connected between the complementary control line 112 and the complementary sensing bitline SBLB. In this case, the second NMOS transistor MN2 may include a gate connected to the complementary bitline BLB (or a sixth node N6).

The offset cancellation circuit 131 may be electrically connected between the bitline BL and the sensing bitline SBL based on an offset cancellation signal P1. Similarly, the offset cancellation circuit 132 may be electrically connected between the complementary bitline BLB and the complementary sensing bitline SBLB based on an offset cancellation signal P1.

The offset cancellation circuit 131 may include a first offset cancellation transistor OC1, and the offset cancellation circuit 132 may include and a second offset cancellation transistor OC2. In this case, the first offset cancellation transistor OC1 may be connected between the bitline BL and the sensing bitline SBL, and may include a gate to receive the offset cancellation signal P1. Similarly, the second offset cancellation transistor OC2 may be connected between the complementary bitline BLB and the complementary sensing bitline SBLB, and may include a gate to receive the offset cancellation signal P1.

The isolation circuit 135 may be electrically connected between the bitline BL and the complementary bitline BLB with the complementary sensing bitline SBLB and the sensing bitline SBL, respectively, based on an isolation signal P2.

In this case, the isolation circuit 135 may include a first isolation transistor ISO1 and a second isolation transistor ISO2. The first isolation transistor ISO1 may be connected between the bitline BL and the complementary sensing bitline SBLB, and the first isolation transistor ISO1 may include a gate to receive the isolation signal P2. The second isolation transistor ISO2 may be connected between the complementary bitline BLB and the sensing bitline SBL, and the second isolation transistor ISO2 may include a gate to receive the isolation signal P2.

The equalizer circuit 141 may be electrically connected between the precharge voltage VBL and the complementary sensing bitline SBLB, and may equalize the bitline BL and the complementary bitline BLB to the precharge voltage VBL based on an equalizing signal PEQ. In this case, the equalizer circuit 141 may include an equalizing transistor EQ. The equalizing transistor EQ may include a source (or a first electrode), a gate to receive the equalizing signal PEQ, and a drain (or a drain electrode or a second electrode). As described above, the sources of the equalizing transistors EQ included in the same bitline sense amplifier group may be electrically connected to each other, and the sources of the equalizing transistors EQ included in the different bitline sense amplifier groups may be electrically separated from each other.

FIGS. 4A, 4B, 4C, 5A and 5B are diagrams illustrating an example of a layout of a sense amplifier circuit of FIG. 2.

Figure 4A:
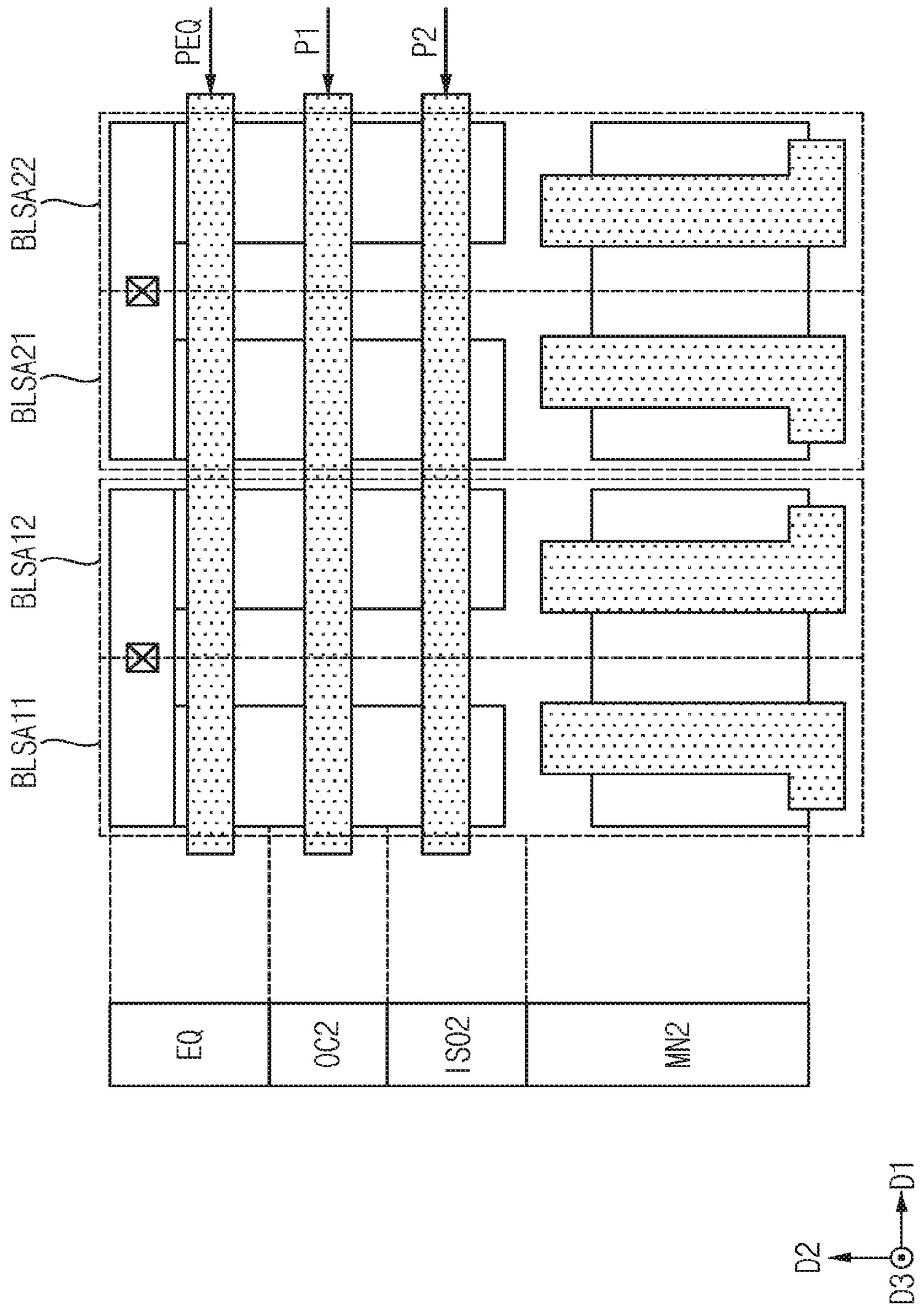
FIGS. 4A, 4B, and 4C are diagrams illustrating an example of a layout of a sense amplifier circuit of FIG. 2.
Figure 4B:
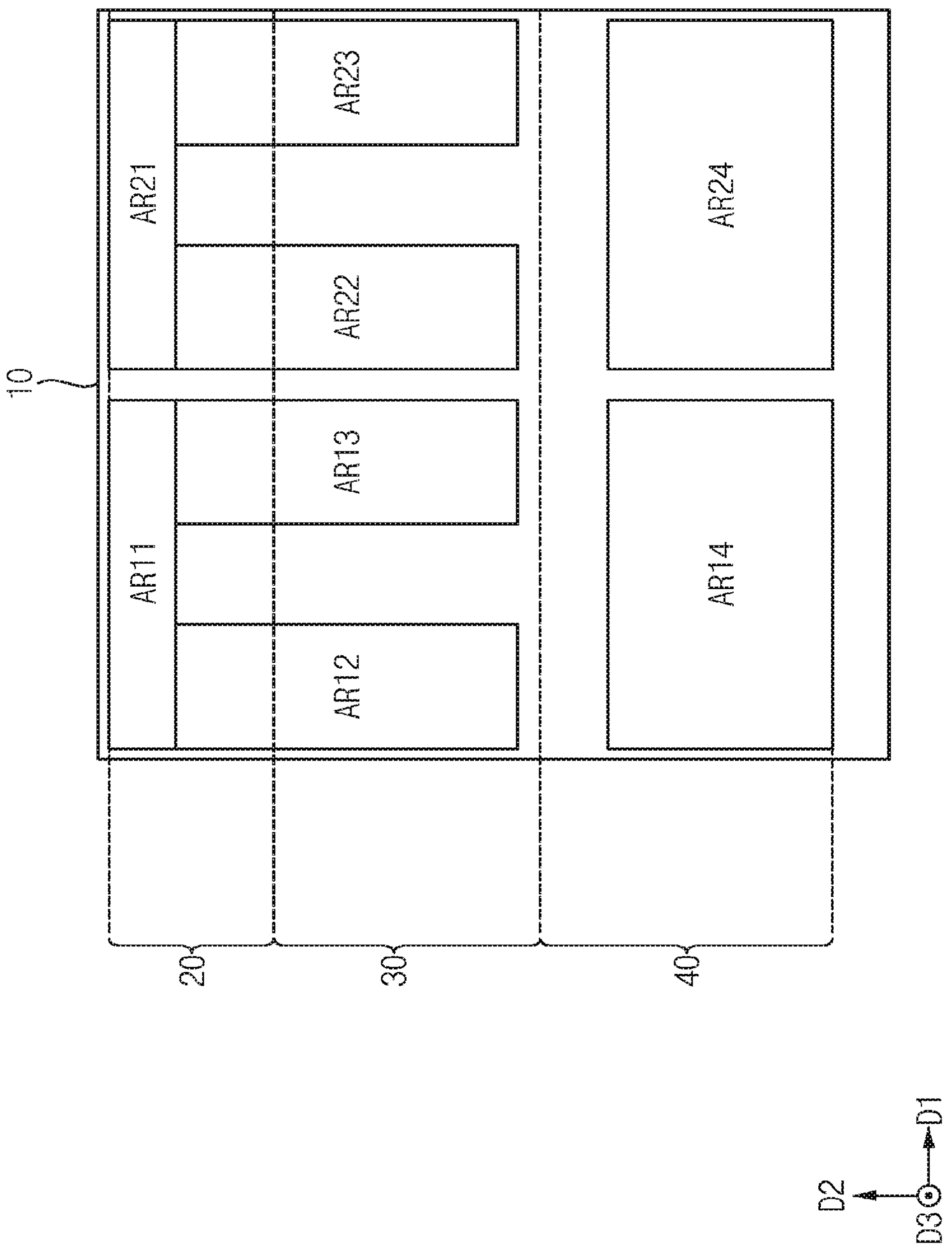
Figure 4C:
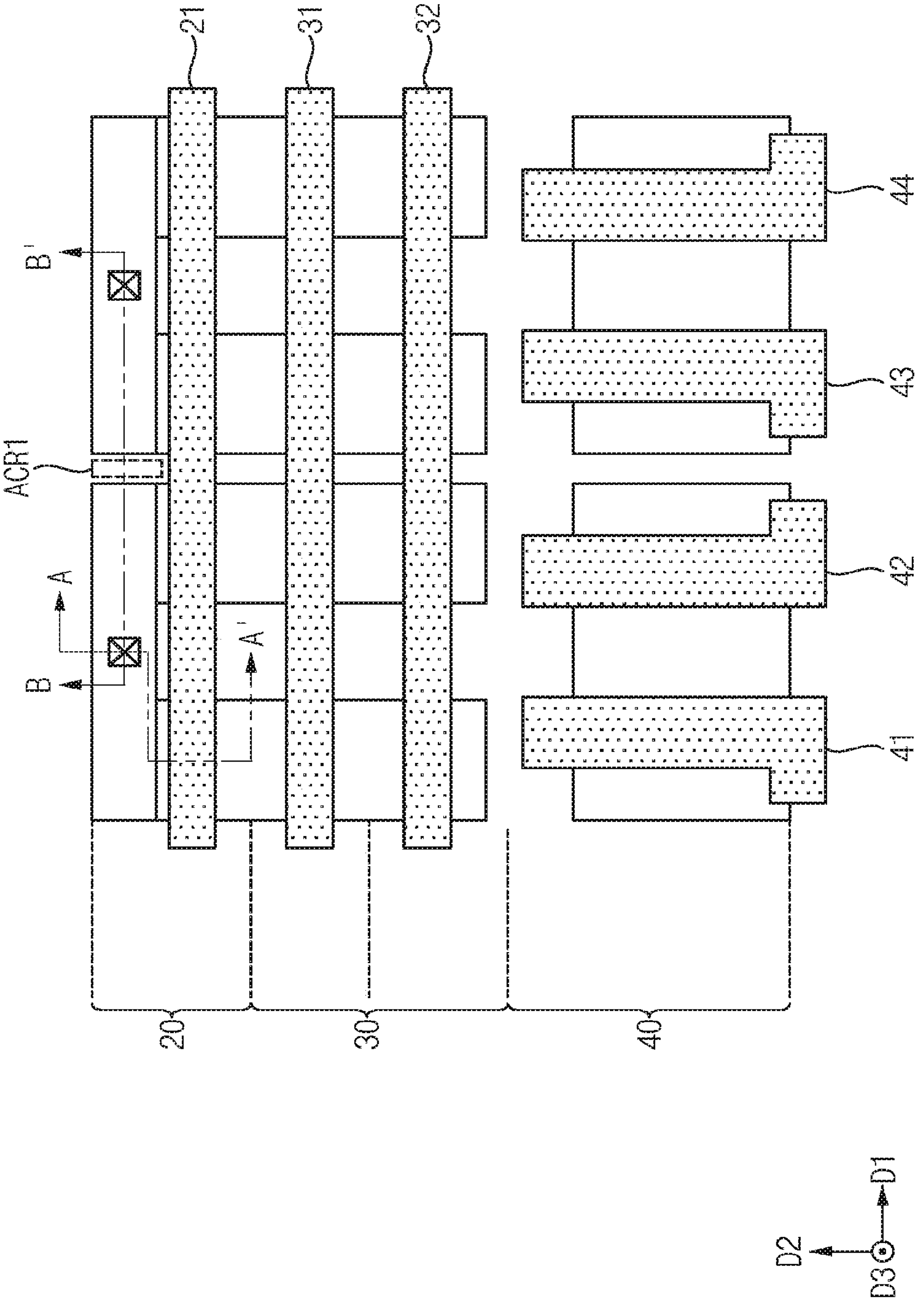

Referring to FIGS. 4A, 4B and 4C, plan views of a portion of a layout of the bitline sense amplifiers BLSA11, BLSA12, BLSA21, and BLSA22 included in the sense amplifier circuit 100*a* are illustrated. For example, when each of the bitline sense amplifiers BLSA11, BLSA12, BLSA21, and BLSA22 has the circuit configuration illustrated in FIG. 3, FIGS. 4A, 4B, and 4C may include layouts illustrating a portion of the right half of components in the bitline sense amplifier 110*a* of FIG. 3.

As depicted in FIGS. 4A, 4B, and 4C, two directions that are each parallel or substantially parallel to a first surface (e.g., a top surface) of a semiconductor substrate 10 and crossing each other are referred to as a first direction D1 (e.g., a X-axis direction) and a second direction D2 (e.g., a Y-axis direction). In addition, a direction vertical or substantially vertical to the first surface of the semiconductor substrate 10 is referred to as a third direction D3 (e.g., a Z-axis direction). For example, the first and second directions D1 and D2 may be perpendicular or substantially perpendicular to each other. In addition, the third direction D3 may be perpendicular or substantially perpendicular to both the first and second directions D1 and D2. Further, a direction indicated by an arrow in the figures and a reverse direction thereof are considered as the same direction. The definition of the first, second, and third directions D1, D2, and D3 are same in the subsequent figures.

A region where the equalizing transistor EQ, the second offset cancellation transistor OC2, the second isolation transistor ISO2 and the second NMOS transistor MN2 among the components included in bitline sense amplifiers BLSA11, BLSA12, BLSA21, and BLSA22 are formed may include or may be divided into a first region 20, a second region 30 adjacent to the first region 20, and a third region 40 adjacent to the second region 30. In this case, the first region 20 may be disposed on the second region 30, and the second region 20 may be disposed on the third region 30 along the second direction D2.

The bitline sense amplifiers BLSA11, BLSA12, BLSA21, and BLSA22 may include active regions AR11, AR12, AR13, AR14, AR21, AR22, AR23, and AR24 that are formed in the semiconductor substrate 10, and may include gate patterns 21, 31, 32, 41, 42, 43, and 44 that are formed on the semiconductor substrate 10 and the active regions AR11, AR12, AR13, AR14, AR21, AR22, AR23, and AR24.

The active region AR11 may be disposed in the first region 20, and may have a rectangular shape with long sides parallel to the first direction D1 and short sides parallel to the second direction D2 in a plan view. The active regions AR12 and AR13 may be disposed in the first region 20 and the second region 30, and each of the active regions AR12 and AR13 may have a rectangular shape with long sides parallel to the second direction D2 and short sides parallel to the first direction D1 in a plan view. The active regions AR12 and AR13 may be disposed below the active region AR11 along the second direction D2, and may be spaced apart from each other along the first direction D1. In this case, one portion of the active region AR12 may be disposed in the first region 20, and the other portion of the active region AR12 may be disposed in the second region 30. Similarly, one portion of the active region AR13 may be disposed in the first region 20, and the other portion of the active region AR13 may be disposed in the second region 30. The active region AR14 may be disposed in the third region 40, and may be spaced apart from the active regions AR12 and AR13 along the second direction D2. For convenience of illustration, the active regions AR11, AR12, and AR13 are described as separate regions, however, example embodiments are not limited thereto. For example, the active regions AR11, AR12, and AR13 may be formed integrally to form one active region.

Arrangements and shapes of the active regions AR21, AR22, AR23 and AR24 may be substantially the same as those of the active regions AR11, AR12, AR13 and AR14. For example, the active region AR21 may be disposed in the first region 20, the active regions AR22 and AR23 may be disposed in the first region 20 and the second region 30, and the active region AR24 may be disposed in the third region 40. In addition, the active regions AR22 and AR23 may be disposed below the active region AR21 along the second direction D2, and the active region AR24 may be spaced apart from the active regions AR22 and AR23 along the second direction D2.

The gate pattern 21 may extend along the first direction D1 on the active regions AR12 and AR13 and the active regions AR22 and AR23 in the first region 20, and may receive the equalizing signal PEQ. The gate patterns 31 and 32 may extend along the first direction D1 on the active regions AR12 and AR13 and the active regions AR22 and AR23 in the second region 30, may be spaced apart from each other along the second direction D2, and may receive the offset cancellation signal P1 and the isolation signal P2, respectively. The gate patterns 41 and 42 may extend along the second direction D2 on the active region AR14 in the third region 40, and may be spaced apart from each other along the first direction D1. The gate patterns 43 and 44 may extend along the second direction D2 on the active region AR24 in the third region 40, and may be spaced apart from each other along the first direction D1.

The active regions AR11, AR12, AR13, and AR14 and the gate patterns 21, 31, 32, 41, and 42 may correspond to the equalizing transistor EQ, the second offset cancellation transistor OC2, the second isolation transistor ISO2 and the second NMOS transistor MN2 that are included in the bitline sense amplifiers BLSA11 and BLSA12.

For example, the active regions AR11, AR12 and AR13 in the first region 20 and the gate pattern 21 in the first region 20 may correspond to the equalizing transistors EQ of the bitline sense amplifiers BLSA11 and BLSA12. In this case, the active regions AR11, AR12 and AR13 in the first region 20 and the gate pattern 21 in the first region 20 may constitute the equalizing transistors EQ of the bitline sense amplifiers BLSA11 and BLSA12. The active region AR12 in the second region 30 and the gate pattern 31 in the second region 30 may correspond to or constitute the second offset cancellation transistor OC2 of the bitline sense amplifier BLSA11. In this case, the active region AR12 in the second region 30 and the gate pattern 31 in the second region 30 may constitute the second offset cancellation transistor OC2 of the bitline sense amplifier BLSA11.The active region AR13 in the second region 30 and the gate pattern 31 in the second region 30 may correspond to the second offset cancellation transistor OC2 of the bitline sense amplifier BLSA12. In this case, the active region AR13 in the second region 30 and the gate pattern 31 in the second region 30 may constitute the second offset cancellation transistor OC2 of the bitline sense amplifier BLSA12. The active region AR12 in the second region 30 and the gate pattern 32 in the second region 30 may correspond to the second isolation transistor ISO2 of the bitline sense amplifier BLSA11, and the active region AR13 in the second region 30 and the gate pattern 32 in the second region 30 may correspond to the second isolation transistor ISO2 of the bitline sense amplifier BLSA12. In this case, the active region AR12 in the second region 30 and the gate pattern 32 in the second region 30 may constitute or form the second isolation transistor ISO2 of the bitline sense amplifier BLSA11, and the active region AR13 in the second region 30 and the gate pattern 32 in the second region 30 may constitute or form the second isolation transistor ISO2 of the bitline sense amplifier BLSA12. The active region AR14 in the third region 40 and the gate pattern 41 in the third region 40 may correspond to the second NMOS transistor MN2 of the bitline sense amplifier BLSA11, and the active region AR14 in the third region 40 and the gate pattern 42 in the third region 40 may correspond to the second NMOS transistor MN2 of the bitline sense amplifier BLSA12. In this case, the active region AR14 in the third region 40 and the gate pattern 41 in the third region 40 may constitute the second NMOS transistor MN2 of the bitline sense amplifier BLSA11, and the active region AR14 in the third region 40 and the gate pattern 42 in the third region 40 may constitute the second NMOS transistor MN2 of the bitline sense amplifier BLSA12.

Similarly, the active regions AR21, AR22, AR23 and AR24 and the gate patterns 21, 31, 32, 43 and 44 may correspond to the equalizing transistor EQ, the second offset cancellation transistor OC2, the second isolation transistor ISO2 and the second NMOS transistor MN2 that are included in the bitline sense amplifiers BLSA21 and BLSA22.

Some active regions AR11 and AR14 for the bitline sense amplifiers BLSA11 and BLSA12 may be connected to each other and may be formed integrally, and thus the bitline sense amplifiers BLSA11 and BLSA12 may be disposed adjacent to each other and may constitute a pair. Likewise, some active regions AR21 and AR24 for the bitline sense amplifiers BLSA21 and BLSA22 may be connected to each other and may be formed integrally, and thus the bitline sense amplifiers BLSA21 and BLSA22 may be disposed adjacent to each other and may constitute a pair. In another example, all active regions AR11, AR12, AR13 and AR14 for the bitline sense amplifiers BLSA11 and BLSA12 and all active regions AR21, AR22, AR23 and AR24 for the bitline sense amplifiers BLSA21 and BLSA22 may be separated from each other, and thus the bitline sense amplifiers BLSA11 and BLSA12 may be arranged to be spaced apart from the bitline sense amplifiers BLSA21 and BLSA22.

In some example embodiments, to separate the sources of the equalizing transistors EQ of the bitline sense amplifiers BLSA11 and BLSA12 from the sources of the equalizing transistors EQ of the bitline sense amplifiers BLSA21 and BLSA22, e.g., to separate the active region AR11 and the active region AR21 from each other, an active cut region ACR1 may be formed between the active region AR11 and the active region AR21. For example, in a manufacturing process, the active regions AR11 and AR21 may be formed integrally, and then the active cut region ACR1 may be formed between the active regions AR11 and AR21 to separate the active regions AR11 and AR21 from each other.

Conventionally, the active regions AR11 and AR21 were connected to each other and formed integrally. However, in the sense amplifier circuit according to example embodiments, the active regions AR11 and AR21 may be separated from each other by forming the active cut region ACR1, and thus the defects in the sense amplifier circuit may be prevented and the size of the sense amplifier circuit may be reduced. In addition, the equalizing transistor EQ and the second cancellation removal transistor OC2 may be formed in adjacent active region (or the same active region), and thus the size of the sense amplifier circuit may be further reduced.

Figure 5A:
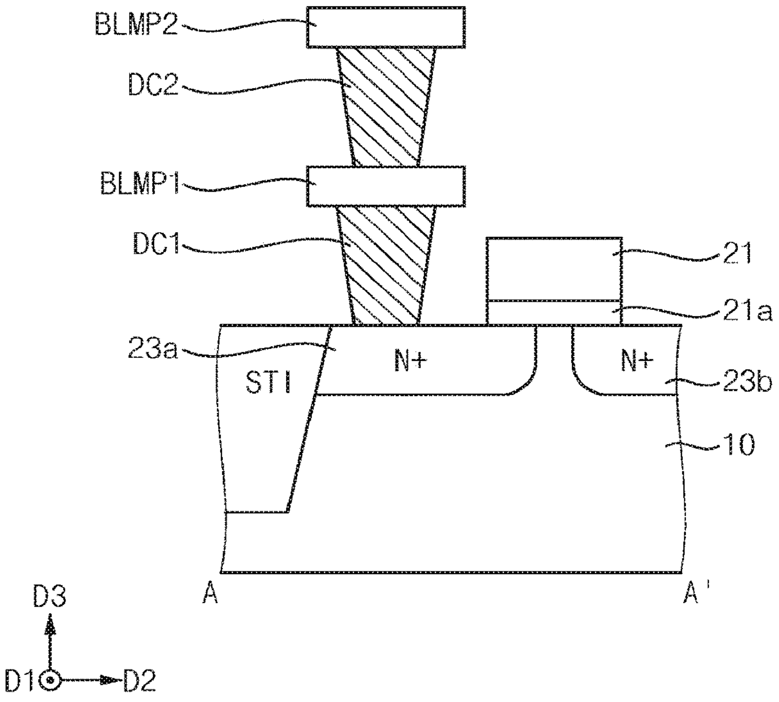
FIG. 5A is a cross-sectional view taken along line A-A' in FIG. 4C.

Referring to FIG. 5A, a cross-sectional view taken along line A-A' in FIG. 4C is illustrated.

In the semiconductor substrate 10, the active regions AR11 and AR12 (or the first region 20) may be defined by a device isolation region STI, and doped regions 23*a* and 23*b* serving as sources and drains of the equalizing transistors EQ of the bitline sense amplifiers BLSA11 and BLSA12 may be formed. For example, the doped regions 23*a* and 23*b* may be N+ doped regions, the doped region 23*a* may be included in the active region AR11, and the doped region 23*b* may be included in the active region AR12. Thereafter, a gate insulating layer 21*a* and the gate pattern 21 disposed on the gate insulating layer 21 serving as gates of the equalizing transistors EQ may be sequentially stacked on the semiconductor substrate 10 along the third direction D3 (e.g., thickness direction).

A first direct contact DC1 may be disposed on the doped region 23*a* included in the active region AR11, and may be electrically connected to the doped region 23*a*. In this case, the first direction contact DC1 may be in direct contact with the doped region 23*a*. A first bitline metal pattern BLMP1 may be disposed on the first direct contact DC1, and may be electrically connected to the first direct contact DC1. A second direct contact DC2 may be disposed on the first bitline metal pattern BLMP1, and may be electrically connected to the first bitline metal pattern BLMP1. A second bitline metal pattern BLMP2 may be disposed on the second direct contact DC2, and may be electrically connected to the second direct contact DC2. In this case, the second bitline metal pattern BLMP2 may be electrically connected to the doped region 23*a*.

Therefore, the precharge voltage VBL may be provided to the doped region 23*a* (e.g., to the active region AR11) through the second bitline metal pattern BLMP2, the second direct contact DC2, the first bitline metal pattern BLMP1 and the first direct contact DC1.

Figure 5B:
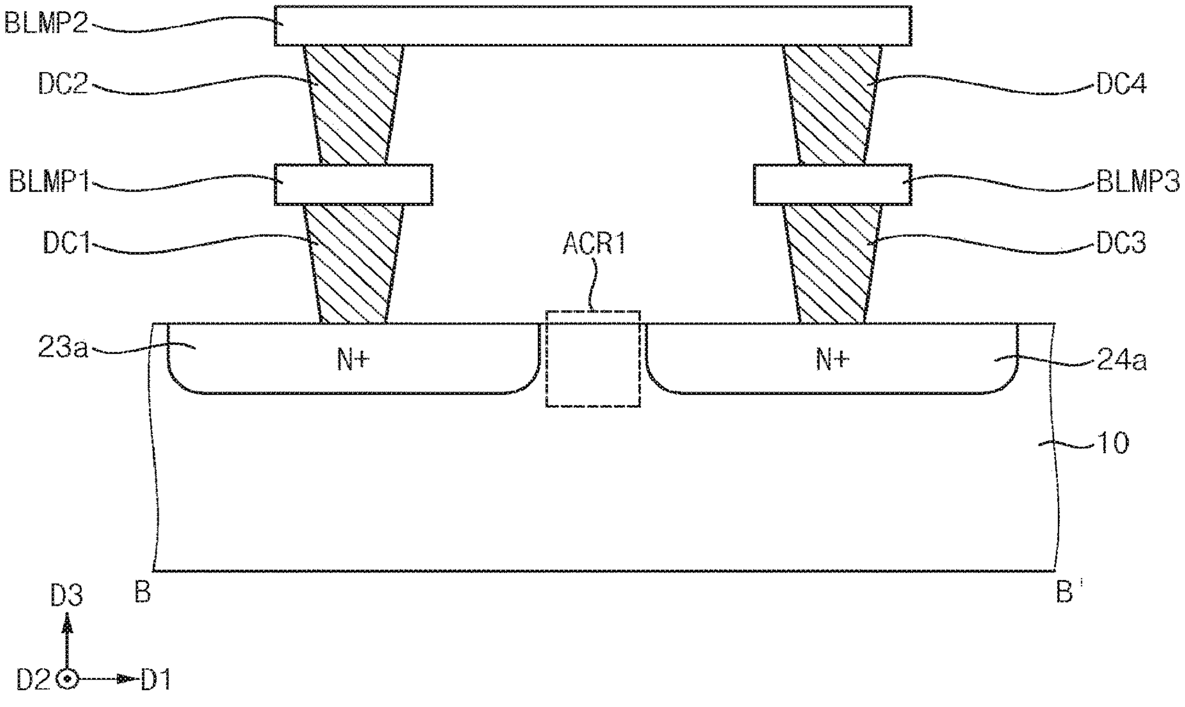
FIG. 5B is a cross-sectional view taken along line B-B' in FIG. 4C.

Referring to FIG. 5B, a cross-sectional view taken along line B-B' in FIG. 4C is illustrated.

In the semiconductor substrate 10, a doped region 24*a* which serves as sources of the equalizing transistors EQ of the bitline sense amplifiers BLSA21 and BLSA22 may be formed. For example, the doped region 24*a* may be an N+ doped region, and may be included in the active region AR21. The active cut region ACR1 may be formed between the active regions AR11 and AR21. In this case, the active cut region ACR1 may be formed between the doped regions 23*a* and 24*a*.

A third direct contact DC3 may be disposed on the doped region 24*a* included in the active region AR21 along the third direction D3, and may be electrically connected to the doped region 24*a*. A third bitline metal pattern BLMP3 may be disposed on the third direct contact DC3, and may be electrically connected to the third direct contact DC3. A fourth direct contact DC4 may be disposed on the third bitline metal pattern BLMP3, and may be electrically connected to the third bitline metal pattern BLMP3. The second bitline metal pattern BLMP2 may extend to be disposed on the fourth direct contact DC4, and may be electrically connected to the fourth direct contact DC4. In this case, the second bitline metal pattern BLMP2 may be electrically connected to the doped regions 23*a* and 24*a*.

Therefore, the precharge voltage VBL may be provided to the doped region 24*a* (e.g., to the active region AR21) through the second bitline metal pattern BLMP2, the fourth direct contact DC4, the third bitline metal pattern BLMP3 and the third direct contact DC3.

As described above, a two-stacked BP structure in which direct contacts and bitline metal patterns are stacked in two layers may be applied employed or adopted to the sense amplifier circuit according to example embodiments. Accordingly, the precharge voltage VBL may be efficiently provided to the active regions AR11 and AR21 while the active cut region ACR1 is formed to separate the active regions AR11 and AR21.

Figure 6A:
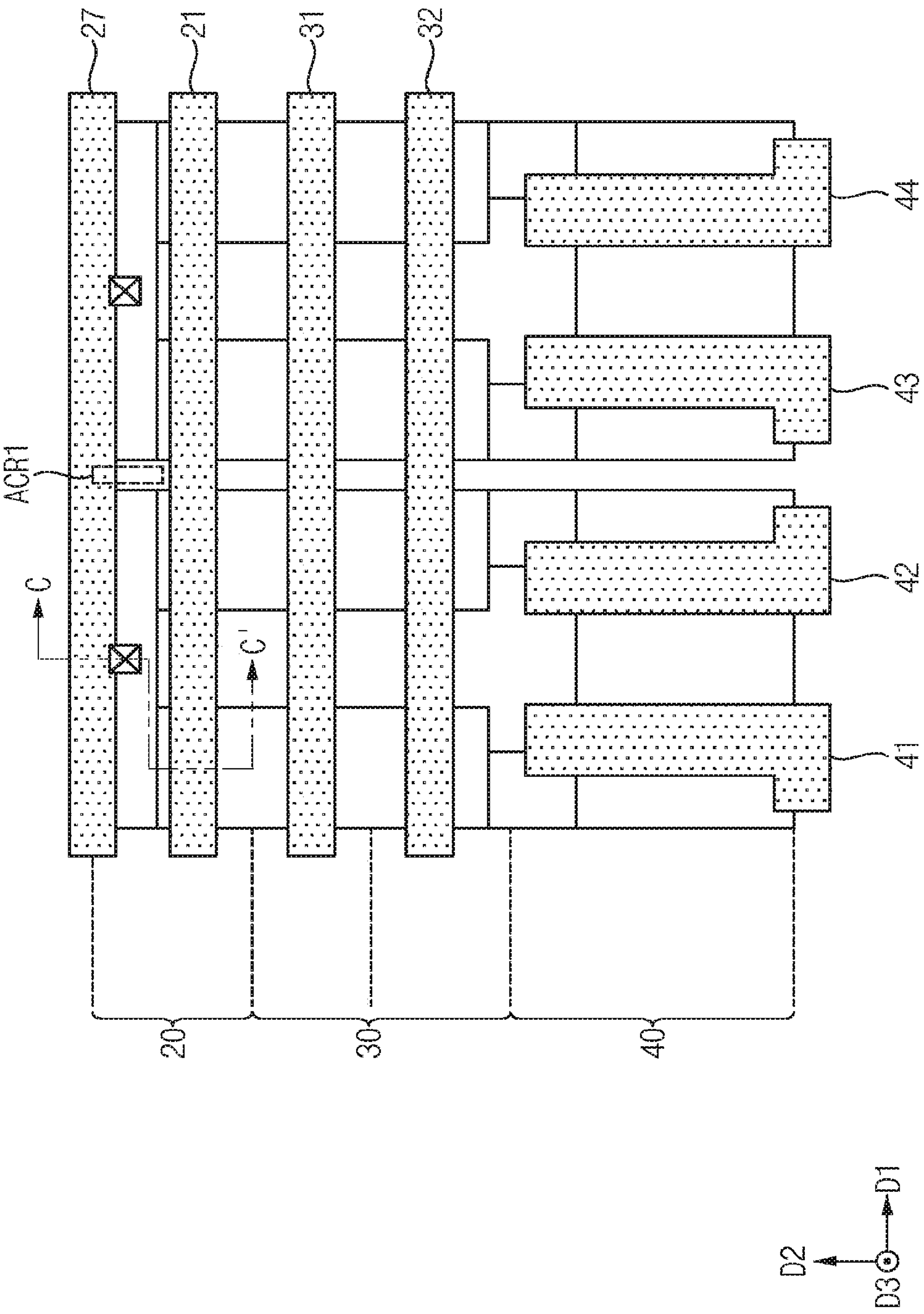
FIG. 6A is a diagram illustrating an example of a layout of a sense amplifier circuit of FIG. 2.
Figure 6B:
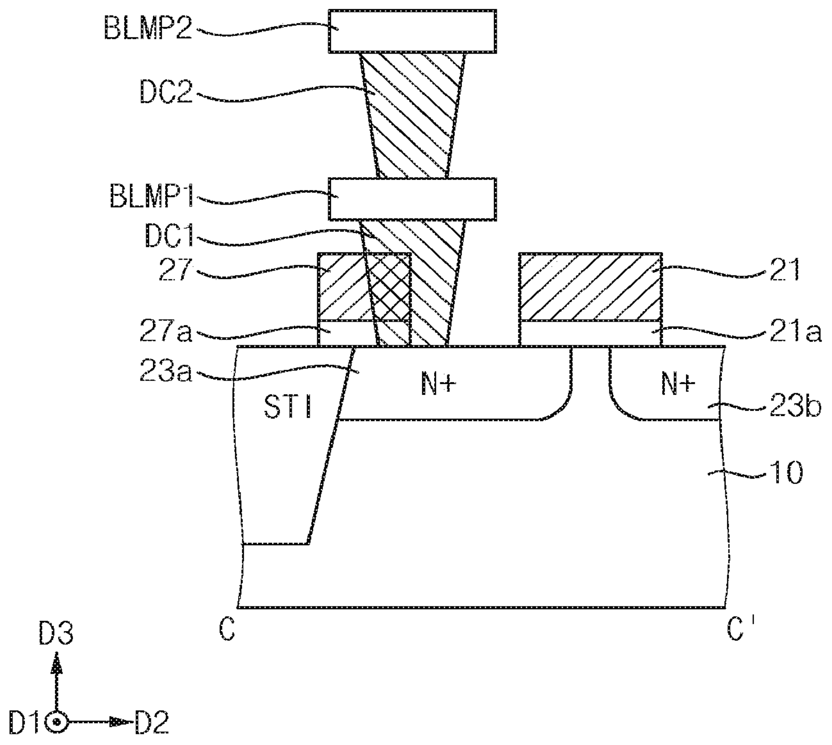
FIG. 6B is a cross-sectional view taken line along C-C' in FIG. 6A.

FIG. 6A is a diagram illustrating an example of a layout of a sense amplifier circuit of FIG. 2. FIG. 6B is a cross-sectional view taken line along C-C' of FIG. 6A.

Referring to FIG. 6A, a plan view of a portion of a layout of the bitline sense amplifiers BLSA11, BLSA12, BLSA21 and BLSA22 included in the sense amplifier circuit 100*a* is illustrated.

An example of FIG. 6A may be substantially the same as the example of FIGS. 4A, 4B and 4C, except that a conductive pattern 27 is further formed. The descriptions repeated with or overlapping with descriptions of FIGS. 4A, 4B and 4C will be omitted in the interest of brevity.

The conductive pattern 27 may be spaced apart from the gate pattern 21 along the second direction D2, and may partially overlap the first region 20. The conductive pattern 27 may extend in the first direction D1. In this case, the conductive pattern 27 may be partially disposed on the active cut region ACR1 along the third direction D3. The conductive pattern 27 may transmit the precharge voltage VBL, and may apply the precharge voltage VBL to the source of the equalizing transistor EQ.

Referring to FIG. 6B, a cross-sectional view taken along line C-C' in FIG. 6A is illustrated. The descriptions repeated with or overlapping with descriptions of FIG. 5A will be omitted in the interest of brevity.

An insulating layer 27*a* and the conductive pattern 27 may be sequentially stacked on the device isolation region STI and the doped region 23*a* along the third direction (e.g., thickness direction), and may be spaced apart from the gate insulating layer 21*a* and the gate pattern 21 disposed on the gate insulating layer 21*a*. The first direct contact DC1 may be electrically connected to the doped region 23*a* serving as the sources of the equalizing transistors EQ by penetrating at least a portion of a wiring structure including the conductive pattern 27 and the insulating layer 27*a* in the third direction D3. Since the precharge voltage VBL is applied to the conductive pattern 27, the precharge voltage VBL may be provided to the sources of the equalizing transistors EQ through the first direct contact DC1.

As described above, the doped region 23*a* serving as the sources of the equalizing transistors EQ may be electrically connected to the conductive pattern 27 through the first direct contact DC1 that penetrates at least a portion of the wiring structure including the conductive pattern 27 and the insulating layer 27*a*, and the conductive pattern 27 may receive the precharge voltage VBL and may provide the precharge voltage VBL to the doped region 23*a* through the first direct contact DC1. Since the precharge voltage VBL does not need to be connected to the doped region 23*a* through an extra metal contact, a width of the bitline metal patterns may be reduced, and a pitch corresponding to a gap between the bitline metal patterns may be increased. Accordingly, the size of the bitline sense amplifier may be reduced, and a degree of wiring freedom may be increased.

Figure 7:
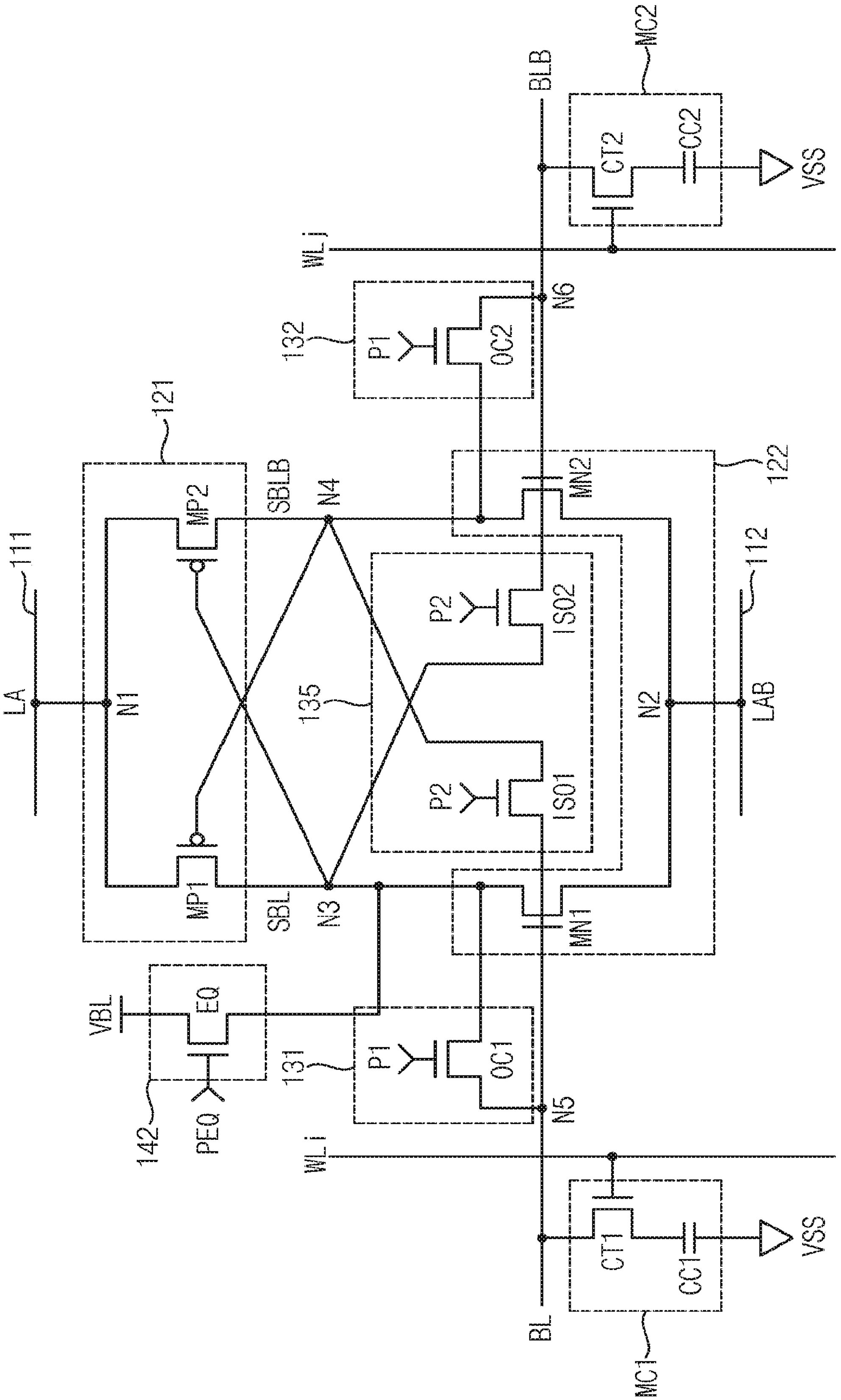
FIG. 7 is a circuit diagram illustrating an example of a bitline sense amplifier included in a sense amplifier circuit according to example embodiments.

FIG. 7 is a circuit diagram illustrating an example of a bitline sense amplifier included in a sense amplifier circuit according to example embodiments.

Referring to FIG. 7, a bitline sense amplifier 110*b* may include an amplifying circuit 121 and 122, an offset cancellation circuit 131 and 132, an isolation circuit 135, and an equalizer circuit 142.

An example of FIG. 7 may be substantially the same as the example of FIG. 3, except that a configuration of the equalizer circuit 142 is partially changed. The descriptions repeated with or overlapping with descriptions of FIG. 3 will be omitted in the interest of brevity.

The equalizer circuit 142 may be connected between the precharge voltage VBL and the sensing bitline SBL, and may equalize the bitline BL and the complementary bitline BLB to the precharge voltage VBL based on the equalizing signal PEQ. The equalizer circuit 142 may include the equalizing transistor EQ. The equalizing transistor EQ may include a source, a gate to receive the equalizing signal PEQ, and a drain. As described above, the sources of the equalizing transistors EQ included in the same bitline sense amplifier group may be electrically connected to each other, and the sources of the equalizing transistors EQ included in the different bitline sense amplifier groups may be electrically separated from each other.

In some example embodiments, when each of the bitline sense amplifiers BLSA11, BLSA12, BLSA21, and BLSA22 included in the sense amplifier circuit 100*a* has the circuit configuration illustrated in FIG. 7, the layouts illustrated in FIGS. 4A, 4B, and 4C may correspond to a portion of the left half of components in the bitline sense amplifier 110*b* of FIG. 7, and may represent a region where the equalizing transistor EQ, the first offset cancellation transistor OC1, the first isolation transistor ISO1 and the first NMOS transistor MN1 among the components included in bitline sense amplifiers BLSA11, BLSA12, BLSA21, and BLSA22 may be formed.

Figure 8:
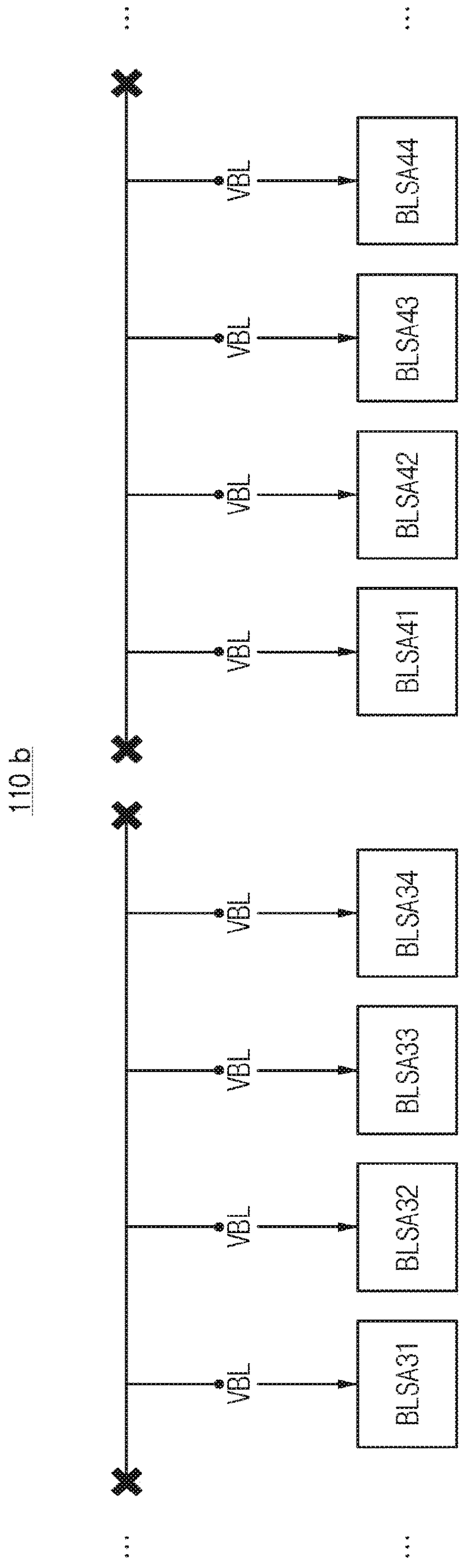
FIG. 8 is a block diagram illustrating an example of a sense amplifier circuit of FIG. 1.

FIG. 8 is a block diagram illustrating an example of a sense amplifier circuit of FIG. 1. The descriptions repeated with or overlapping with descriptions of FIG. 2 will be omitted in the interest of brevity.

Referring to FIG. 8, a sense amplifier circuit 100*b* may include a first bitline sense amplifier BLSA31, a second bitline sense amplifier BLSA32, a third bitline sense amplifier BLSA33, a fourth bitline sense amplifier BLSA34, a fifth bitline sense amplifier BLSA41, a sixth bitline sense amplifier BLSA42, a seventh bitline sense amplifier BLSA43 and an eighth bitline sense amplifier BLSA44.

In an example of FIG. 8, the first to fourth bitline sense amplifiers BLSA31, BLSA32, BLSA33 and BLSA34 may form one bitline sense amplifier group, and the fifth to eighth bitline sense amplifiers BLSA41, BLSA42, BLSA43, and BLSA44 may form another bitline sense amplifier group. In this case, each of the first to fourth bitline sense amplifiers BLSA31, BLSA32, BLSA33 and BLSA34 may be connected to the precharge voltage VBL. In addition, each of the fifth to eighth bitline sense amplifiers BLSA41, BLSA42, BLSA43, and BLSA44 may be connected to the precharge voltage VBL.

For example, the first to fourth bitline sense amplifiers BLSA31, BLSA32, BLSA33, and BLSA34 may be included in a first group of bitline sense amplifiers. Among the first group of bitline sense amplifiers, the first and second bitline sense amplifiers BLSA31 and BLSA32 may be disposed adjacent to each other, the third and fourth bitline sense amplifiers BLSA33 and BLSA34 may be disposed adjacent to each other, and the first and second bitline sense amplifiers BLSA31 and BLSA32 may be spaced apart from the third and fourth bitline sense amplifiers BLSA33 and BLSA34. In this case, sources of first equalizing transistors included in the first group of bitline sense amplifiers may be electrically connected to each other, and active regions corresponding to the sources of the first equalizing transistors may be integrally formed.

Similarly, the fifth to eighth bitline sense amplifiers BLSA41, BLSA42, BLSA43, and BLSA44 may be included in a second group of bitline sense amplifiers. Among the second group of bitline sense amplifiers, the fifth and sixth bitline sense amplifiers BLSA41 and BLSA42 may be disposed adjacent to each other, the seventh and eighth bitline sense amplifiers BLSA43 and BLSA44 may be disposed adjacent to each other, and the fifth and sixth bitline sense amplifiers BLSA41 and BLSA42 may be spaced apart from the seventh and eighth bitline sense amplifiers BLSA43 and BLSA44. In this case, sources of second equalizing transistors included in the second group of bitline sense amplifiers may be electrically connected to each other, and active regions corresponding to the sources of the second equalizing transistors may be integrally formed.

The sources of the first equalizing transistors and the sources of the second equalizing transistors may be electrically isolated from each other, and the active regions corresponding to the sources of the first equalizing transistors and the active regions corresponding to the sources of the second equalizing transistors may be separated from each other.

Figure 9:
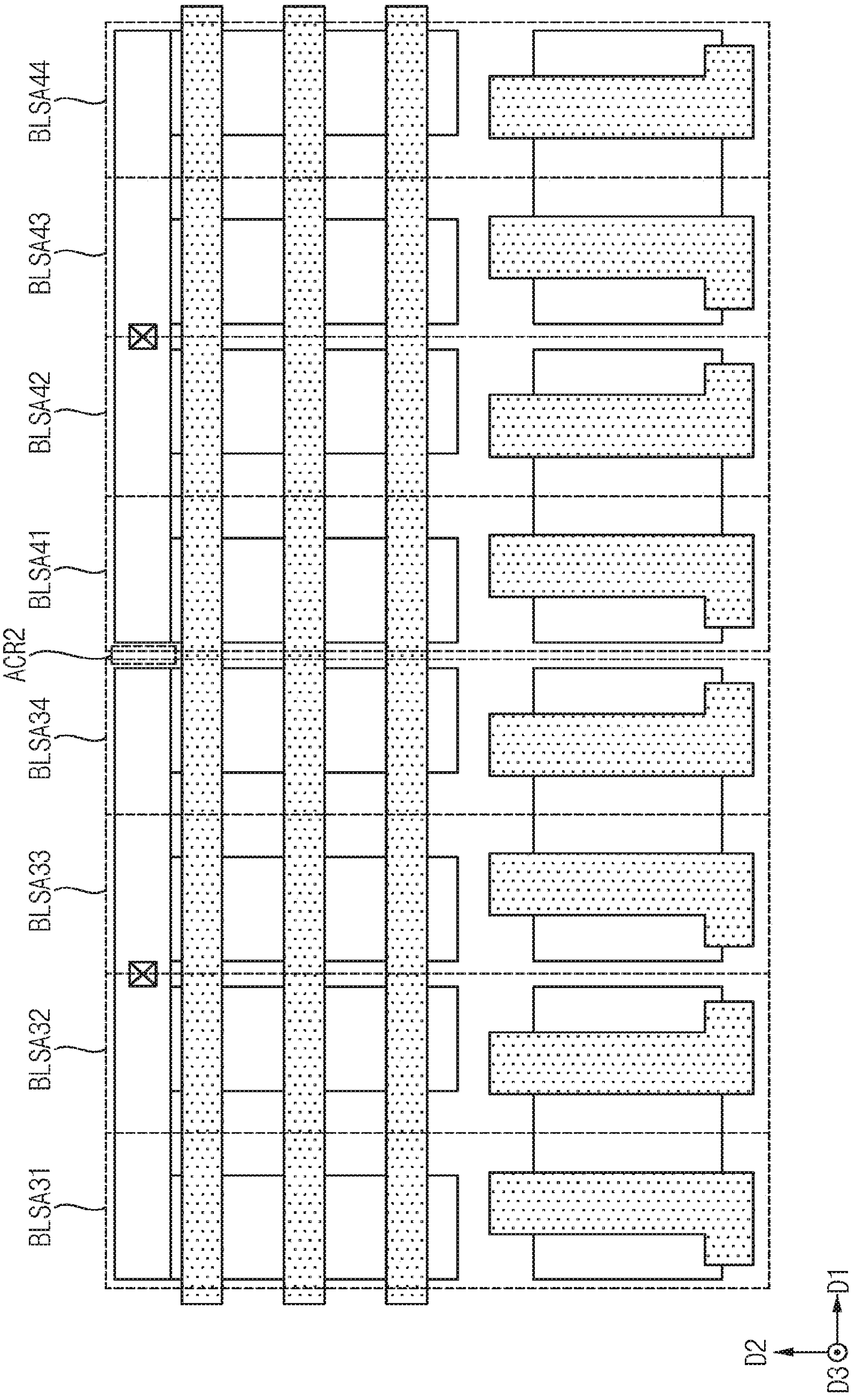
FIG. 9 is a diagram illustrating an example of a layout of a sense amplifier circuit of FIG. 8.

FIG. 9 is a diagram illustrating an example of a layout of a sense amplifier circuit of FIG. 8. The descriptions repeated with or overlapping with descriptions of FIGS. 4A, 4B, 4C, 5A, and 5B will be omitted.

Referring to FIG. 9, a plan view of a portion of a layout of the bitline sense amplifiers BLSA31, BLSA32, BLSA33, BLSA34, BLSA41, BLSA42, BLSA43, and BLSA44 included in the sense amplifier circuit 100*b* is illustrated. For example, when each bitline sense amplifier has the circuit configuration illustrated in FIG. 3, FIG. 9 may include a layout illustrating a portion of the right half of components in the bitline sense amplifier 110*a* of FIG. 3. For example, when each bitline sense amplifier has the circuit configuration illustrated in FIG. 7, FIG. 9 may include a layout illustrating a portion of the left half of components in the bitline sense amplifier 110*b* of FIG. 7

Configurations of the bitline sense amplifiers BLSA31, BLSA32, BLSA33, and BLSA34 may be substantially the same as the configurations of the bitline sense amplifiers BLSA11, BLSA12, BLSA21, and BLSA22 of FIGS. 4A, 4B and 4C. However, unlike the bitline sense amplifiers BLSA11, BLSA12, BLSA21, and BLSA22 of FIGS. 4A, 4B and 4C, the bitline sense amplifiers BLSA31, BLSA32, BLSA33, and BLSA34 may include that sources of the equalizing transistors EQ included in the bitline sense amplifiers BLSA31, BLSA32, BLSA33, and BLSA34 and corresponding active regions are connected to each other and are integrally formed. Similarly, configurations of the bitline sense amplifiers BLSA41, BLSA42, BLSA43, and BLSA44 may be substantially the same as the configurations of the bitline sense amplifiers BLSA11, BLSA12, BLSA21, and BLSA22 of FIGS. 4A, 4B and 4C. However, unlike the bitline sense amplifiers BLSA11, BLSA12, BLSA21, and BLSA22 of FIGS. 4A, 4B and 4C, the bitline sense amplifiers BLSA41, BLSA42, BLSA43, and BLSA44 may include that sources of the equalizing transistors EQ included in the bitline sense amplifiers BLSA41, BLSA42, BLSA43, and BLSA44 and corresponding active regions are connected to each other and are integrally formed.

In some example embodiments, to separate the sources of the equalizing transistors EQ of the bitline sense amplifiers BLSA31, BLSA32, BLSA33, and BLSA34 and the corresponding active regions from the sources of the equalizing transistors EQ of the bitline sense amplifiers BLSA41, BLSA42, BLSA43, and BLSA44 and the corresponding active regions, an active cut region ACR2 may be formed. In this case, the active cut region ACR2 may be formed between the bitline sense amplifiers BLSA31, BLSA32, BLSA33, and BLSA34 and the bitline sense amplifiers BLSA41, BLSA42, BLSA43, and BLSA44.

Although example embodiments are described based on the examples where the number of bitline sense amplifiers included in one bitline sense amplifier group is two and four, example embodiments are not limited thereto, and the number of bitline sense amplifiers included in one bitline sense amplifier group may be variously determined according to example embodiments.

FIGS. 10, 11, 12A, 12B, 12C, 12D, 12E, 13A, and 13B are diagrams for describing an operation of a bitline sense amplifier included in a sense amplifier circuit according to example embodiments.

Figure 10:
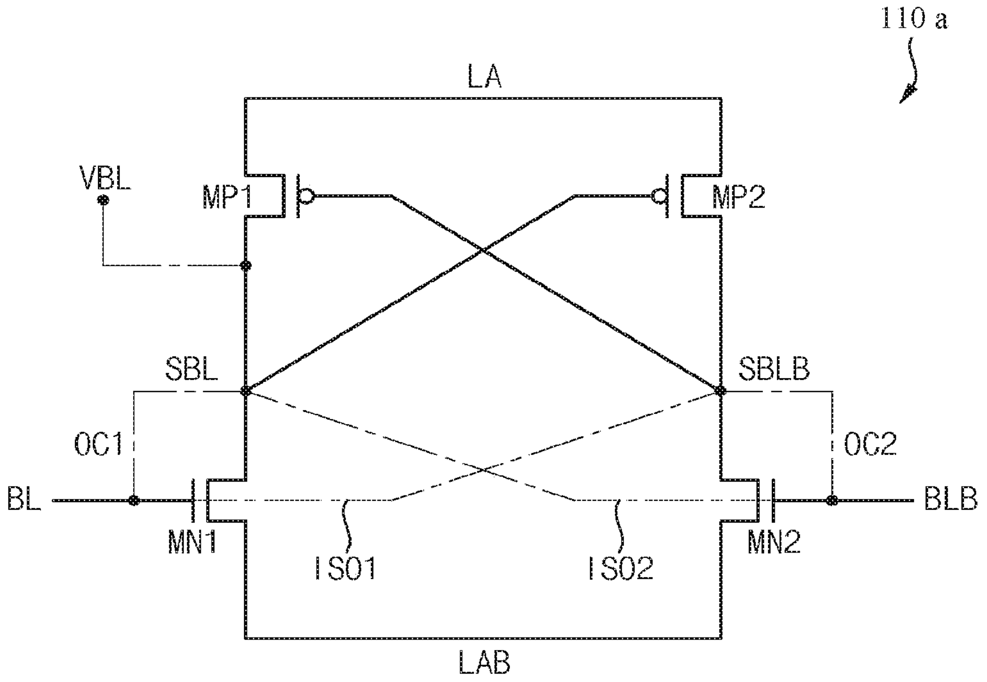
FIGS. 10, 11, 12A, 12B, 12C, 12D, 12E, 13A and 13B are diagrams for describing an operation of a bitline sense amplifier included in a sense amplifier circuit according to example embodiments.

Referring to FIG. 10, an equivalent circuit of the bitline sense amplifier 110*a* of FIG. 3 is illustrated. For simplicity of drawings, the equalizing transistor EQ, the first and second offset cancellation transistors OC1 and OC2, and the first and second isolation transistors ISO1 and ISO2 are illustrated by dashed lines. Operations of the equivalent circuit of the bitline sense amplifier 110*a* illustrated in FIG. 10 will be described in detail with reference to FIGS. 11, 12A, 12B, 12C, 12D, and 12E.

Figure 11:
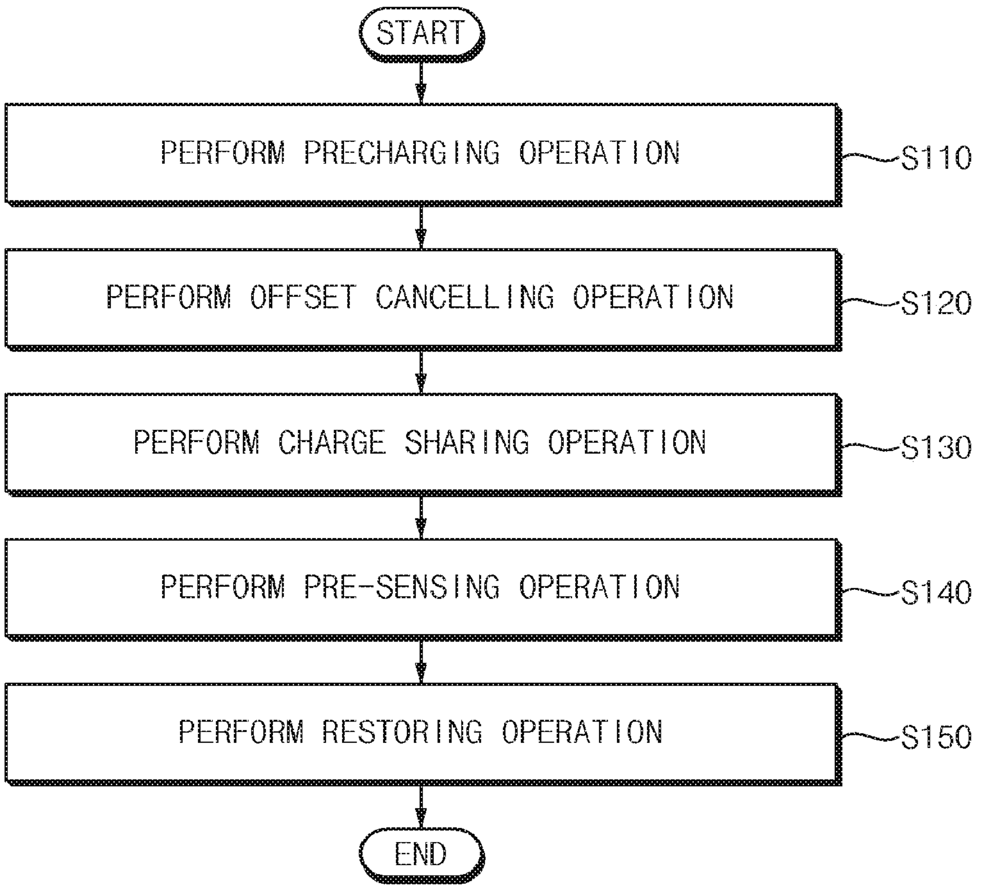

Referring to FIG. 11, the bitline sense amplifier 110*a* may sequentially include steps of performing a precharging operation (S110), performing an offset cancelling operation (S120), performing a charge sharing operation (S130), performing a pre-sensing operation (S140), and performing a restoring operation (S150) in response to the equalizing signal PEQ, the offset cancellation signal P1, the isolation signal P2, and the first and second control signals LA and LAB. For convenience of description, the operations in FIG. 11 will be described with reference to FIGS. 12A, 12B, 12C, 12D and 12E.

Figure 12A:
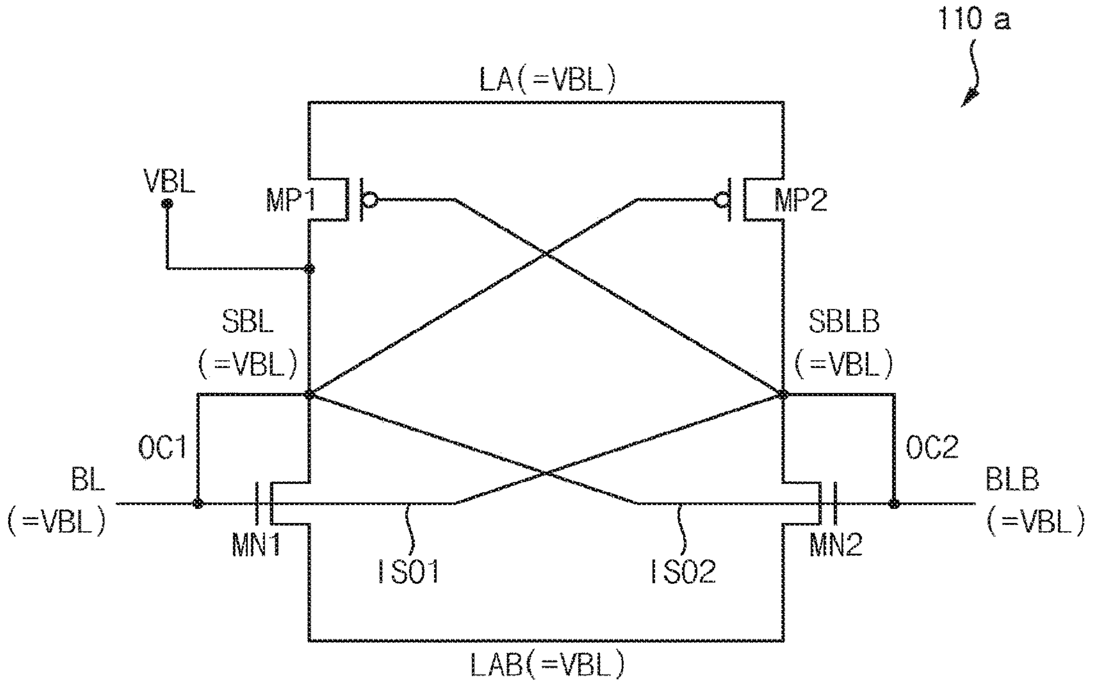

Referring to FIG. 12A, in operation S110 of FIG. 11, the bitline sense amplifier 110*a* may perform the precharging operation (S110). The bitline sense amplifier 110*a* may precharge the bitline BL, the complementary bitline BLB, the sensing bitline SBL, and the complementary sensing bitline SBLB to the precharge voltage VBL. For example, the equalizing signal PEQ, the offset cancellation signal P1, and the isolation signal P2 may have a logic high level (e.g., High as shown in FIG. 13B).

Firstly, the precharge voltage VBL may be provided to the sensing bitline SBL in response to the equalizing signal PEQ having the logic high level (e.g., High), and then, the first and second offset cancellation transistors OC1 and OC2 may be turned on in response to the offset cancellation signal P1 having the logic high level, and the first and second isolation transistors ISO1 and ISO2 may be turned on in response to the isolation signal P2 having the logic high level (e.g., High). Therefore, the bitline BL, the complementary bitline BLB, the sensing bitline SBL, and the complementary sensing bitline SBLB may be connected to one node and may be charged to the precharge voltage VBL. In this case, the first and second control signals LA and LAB may be charged to the precharge voltage VBL. Thus, in this case, the bitline BL, the complementary bitline BLB, the sensing bitline SBL, the complementary sensing bitline SBLB, and the first and second control signals LA and LAB may be equally charged to the precharge voltage VBL.

Figure 12B:
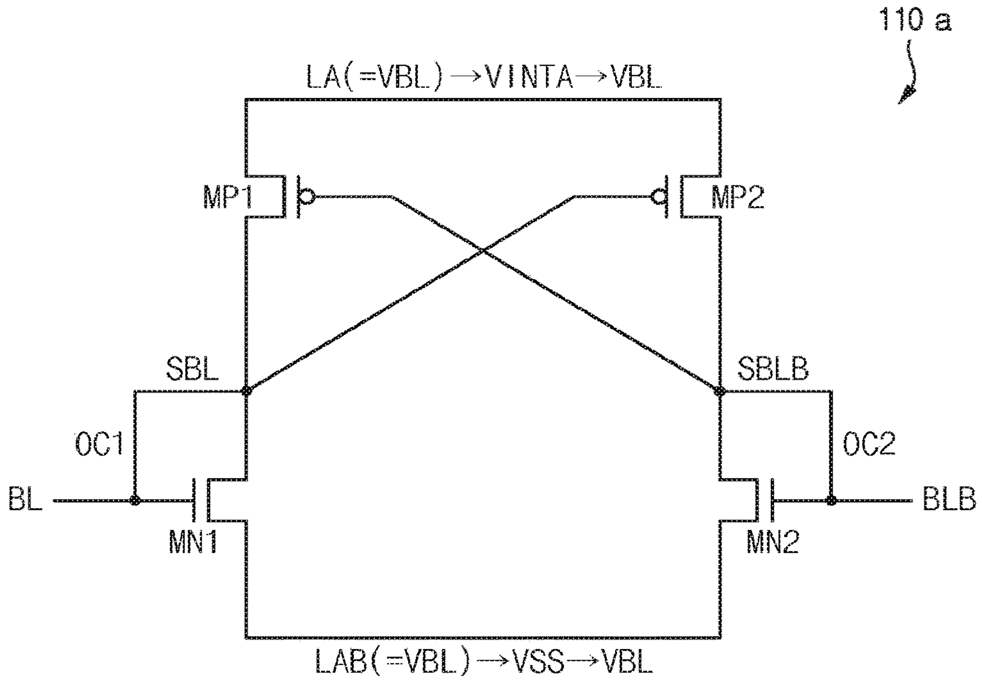

Referring to FIG. 12B, in operation S120 of FIG. 11, the bitline sense amplifier 110*a* may perform the offset cancelling operation. For example, the isolation signals P2 may have a logic low level (e.g., Low as shown in FIG. 13B), and the offset cancellation signals P1 may have the logic high level (e.g., High as shown in FIG. 13B).

The first and second isolation transistors ISO1 and ISO2 may be turned off in response to the isolation signal P2 having the logic low level, and the first and second offset cancellation transistors OC1 and OC2 may be turned on in response to the offset cancellation signal P1 having the logic high level. In this case, the first control signal LA may be transitioned from the precharge voltage VBL to an internal power supply voltage VINTA, and the second control signal LAB may be transitioned from the precharge voltage VBL to a ground voltage VSS. The internal power supply voltage VINTA may be a voltage supplied to a memory cell array (e.g., a memory cell array 300 in FIG. 14). Thereafter, the first control signal LA may be transitioned from the internal power supply voltage VINTA to the precharge voltage VBL, and the second control signal LAB may be transitioned from the ground voltage VSS to the precharge voltage VBL.

In the bitline sense amplifier 110*a*, for example, the first and second PMOS transistors MP1 and MP2 and the first and second NMOS transistors MN1 and MN2 may have different threshold voltages (e.g., Vth) than each other due to a variation in manufacturing processes, temperature, or the like. In this case, the bitline sense amplifier 110*a* may cause offset noise due to the differences between the threshold voltages of the first and second PMOS transistors MP1 and MP2 and the first and second NMOS transistors MN1 and MN2.

In some example embodiments, an offset of the bitline sense amplifier 110*b* may be compensated based on the offset cancelling operation, which will be described with reference to first to fourth examples (e.g., Cases I to IV) in FIG. 13A.

Figure 13A:
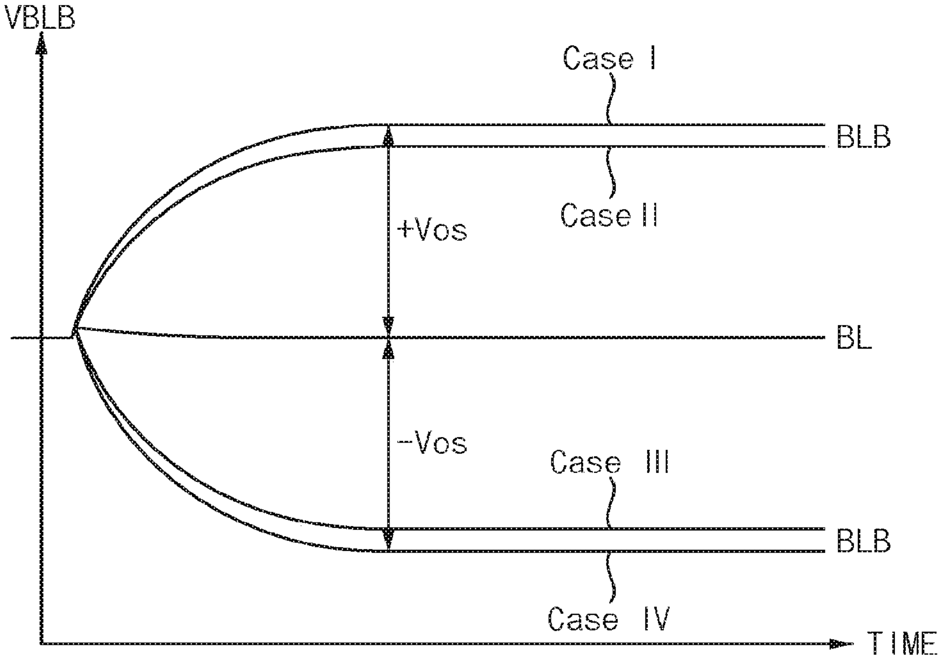
Figure 13B:
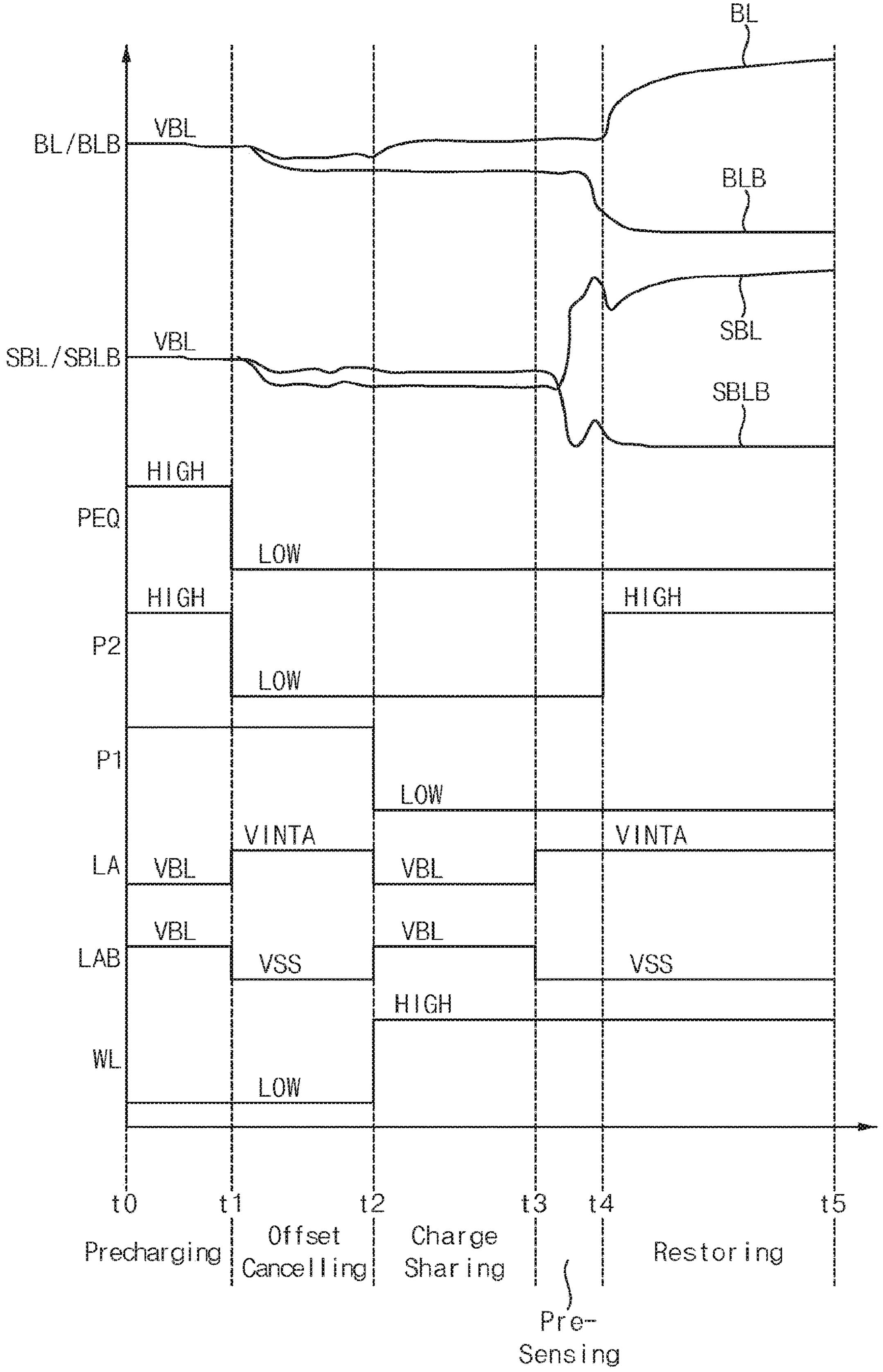

In a first example (e.g., Case I) of FIG. 13A, it is assumed that the threshold voltage of the first NMOS transistor MN1 is greater than the threshold voltage of the second NMOS transistor MN2. In this case, the first and second NMOS transistors MN1 and MN2 may operate as diodes. The amount of current which flows through the first NMOS transistor MN1 may be less than the amount of current which flows through the second NMOS transistor MN2. Also, the amount of current which flows through the first PMOS transistor MP1 may be less than the amount of current which flows through the second PMOS transistor MP2. Thus, as illustrated in FIG. 13A, a voltage of the complementary bitline BLB may be increased to a predetermined level which is greater than a voltage of the bitline BL.

In a second example (e.g., Case II) of FIG. 13A, it is assumed that the threshold voltage of the second NMOS transistor MN2 is greater than the threshold voltage of the first NMOS transistor MN1. In this case, the first and second NMOS transistors MN1 and MN2 may operate as diodes. The amount of current which flows through the second NMOS transistor MN2 may be less than the amount of current which flows through the first NMOS transistor MN1. Also, the amount of current which flows through the second PMOS transistor MP2 may be less than the amount of current which flows through the first PMOS transistor MP1. Thus, as illustrated in FIG. 13A, the voltage of the complementary bitline BLB may be decreased to a predetermined level which is less than the voltage of the bitline BL.

In a third example (e.g., Case III) of FIG. 13A, it is assumed that the threshold voltage of the first PMOS transistor MP1 is greater than the threshold voltage of the second PMOS transistor MP2. The amount of current which flows through the first PMOS transistor MP1 may be less than the amount of current which flows through the second PMOS transistor MP2. The first and second NMOS transistors MN1 and MN2 may flow a predetermined amount of current as diodes. Thus, as illustrated in FIG. 13A, the voltage of the complementary bitline BLB may be increased to a predetermined level which is greater than the voltage of the bitline BL.

In a fourth example (e.g., Case IV) of FIG. 13A, it is assumed that the threshold voltage of the second PMOS transistor MP2 is greater than the threshold voltage of the first PMOS transistor MP1. The amount of current which flows through the second PMOS transistor MP2 may be less than the amount of current which flows through the first PMOS transistor MP1. The first and second NMOS transistors MN1 and MN2 may flow a predetermined amount of current as diodes. Thus, as illustrated in FIG. 13A, the voltage of the complementary bitline BLB may be decreased to a predetermined level which is less than the voltage of the bitline BL.

In the above-described first to fourth examples (e.g., Cases I to IV), the voltage of the complementary bitline BLB may be increased or decreased to the predetermined level as compared to the voltage of the bitline BL, and thus the bitline BL and the complementary bitline BLB may have a predetermined voltage difference. Such voltage difference may be interpreted as an offset voltage due to the offset noise. This means that the offset noise of the bitline sense amplifier 110*a* may be cancelled by causing the bitline BL and the complementary bitline BLB to have a voltage difference by the offset voltage. In other words, the bitline sense amplifier 110*a* may compensate for the offset by the offset cancelling operation.

Figure 12C:
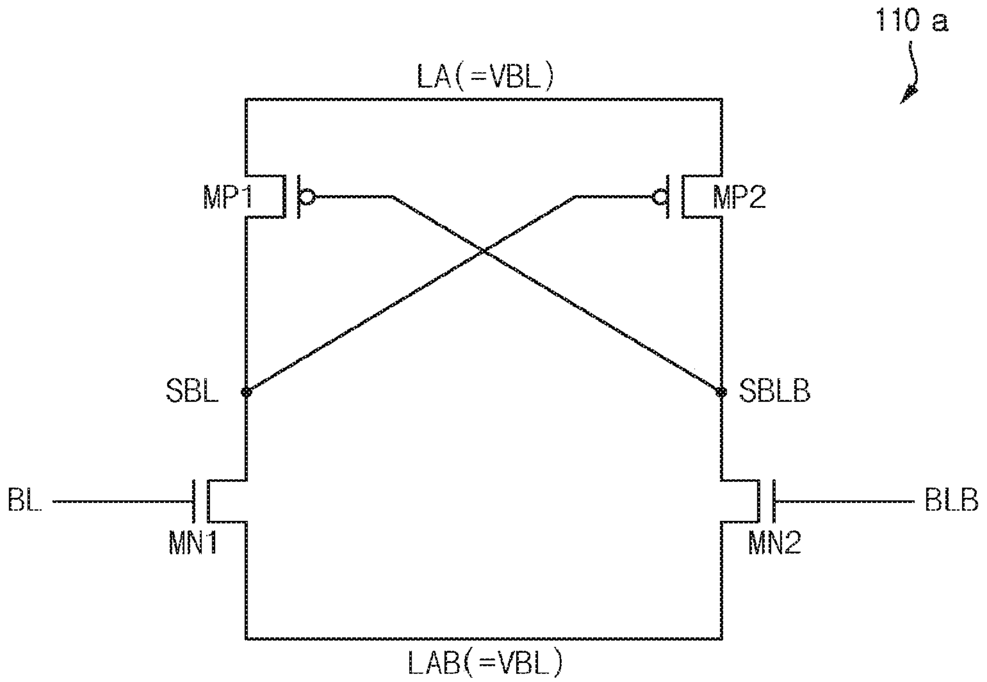

Referring to FIG. 12C, in operation S130 of FIG. 11, the bitline sense amplifier 110*a* may perform the charge sharing operation. For example, the offset cancellation signal P1 and the isolation signal P2 may have the logic low level (e.g., Low as shown in FIG. 13B).

The first and second offset cancellation transistors OC1 and OC2 and the first and second isolation transistors ISO1 and ISO2 may be turned off in response to the offset cancellation signal P1 and the isolation signal P2 having the logic low level (e.g., Low as shown in FIG. 13B). In this case, the wordline WLi connected to a memory cell (e.g., the memory cell MC1 in FIG. 3) may be activated, and the charge sharing operation may be performed between electric charges stored in a cell capacitor (e.g., the cell capacitor CC1 in FIG. 3) of the memory cell and electric charges stored in the bitline BL. In this case, the first control signal LA and the second control signal LAB may have the precharge voltage VBL.

For example, when data having a value of '1' is stored in the memory cell, the voltage of the bitline BL may increase by a predetermined level during the charge sharing operation. On the other hand, when data having a value of '0' is stored in the memory cell, the voltage of the bitline BL may decrease by a predetermined level during the charge sharing operation.

Figure 12D:
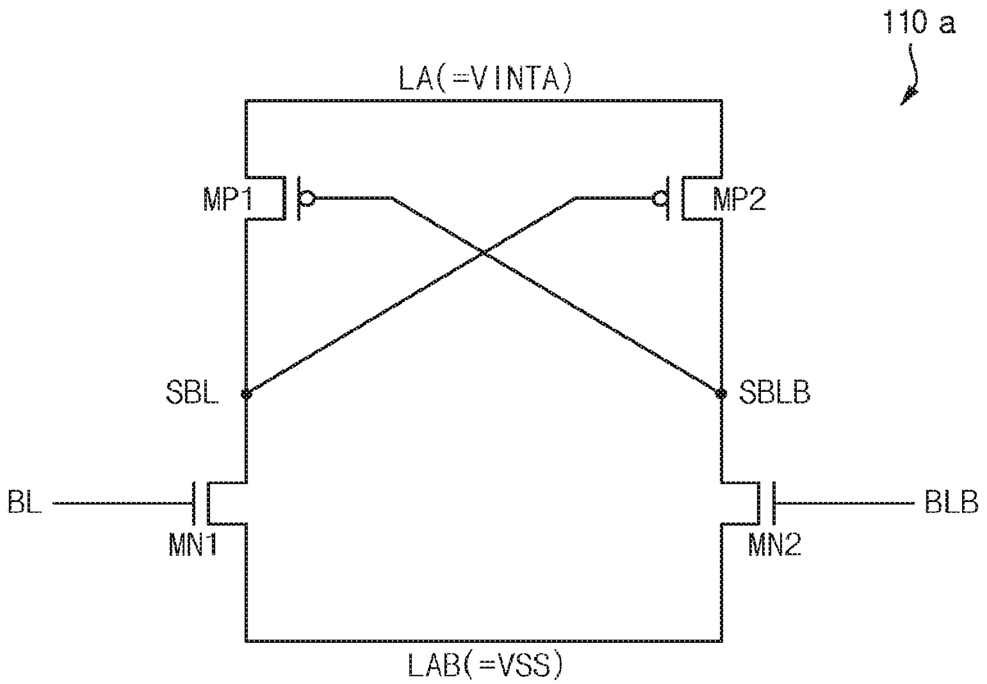

Referring to FIG. 12D, in operation S140 of FIG. 11, the bitline sense amplifier 110*a* may perform the pre-sensing operation. For example, the offset cancellation signal P1 and the isolation signal P2 may have the logic low level (e.g., Low as shown in FIG. 13B).

When the charge sharing operation described in FIG. 12C is performed, the voltage of the bitline BL may increase or decrease by a predetermined level (e.g., ΔV) depending on the data stored in the memory cell. In this case, the first control signal LA may be transitioned to the internal power supply voltage VINTA from the precharge voltage VBL, and the second control signal LAB may be transitioned to the ground voltage VSS from precharge voltage VBL. Thus, the bitline sense amplifier 110*a* may charge the voltages of the sensing bitline SBL and the complementary sensing bitline SBLB to the internal power supply voltage VINTA, and may discharge the voltages of the sensing bitline SBL and the complementary sensing bitline SBLB to the ground voltage VSS based on the voltage difference between the bitline BL and the complementary bitline BLB.

For example, when data having a value of '1' is stored in the memory cell, the voltage of the sensing bitline SBL may increase to the internal power supply voltage VINTA, and the voltage of the complementary sensing bitline SBLB may decrease to the ground voltage VSS during the pre-sensing operation. On the other hand, when data having a value of '0' is stored in the memory cell, the voltage of the sensing bitline SBL may decrease to the ground voltage VSS, and the voltage of the complementary sensing bitline SBLB may increase to the internal power supply voltage VINTA.

For example, during the pre-sensing operation, the bitline BL and the complementary bitline BLB, and the sensing bitline SBL and the complementary sensing bitline SBLB may be disconnected from each other by the first and second isolation transistors ISO1 and ISO2 and the first and second offset cancellation transistors OC1 and OC2. When the bitline sense amplifier 110*a* is separated from the bitline BL and the complementary bitline BLB, a coupling effect between the bitlines BL may be reduced and a sensing rate may be improved.

Figure 12E:
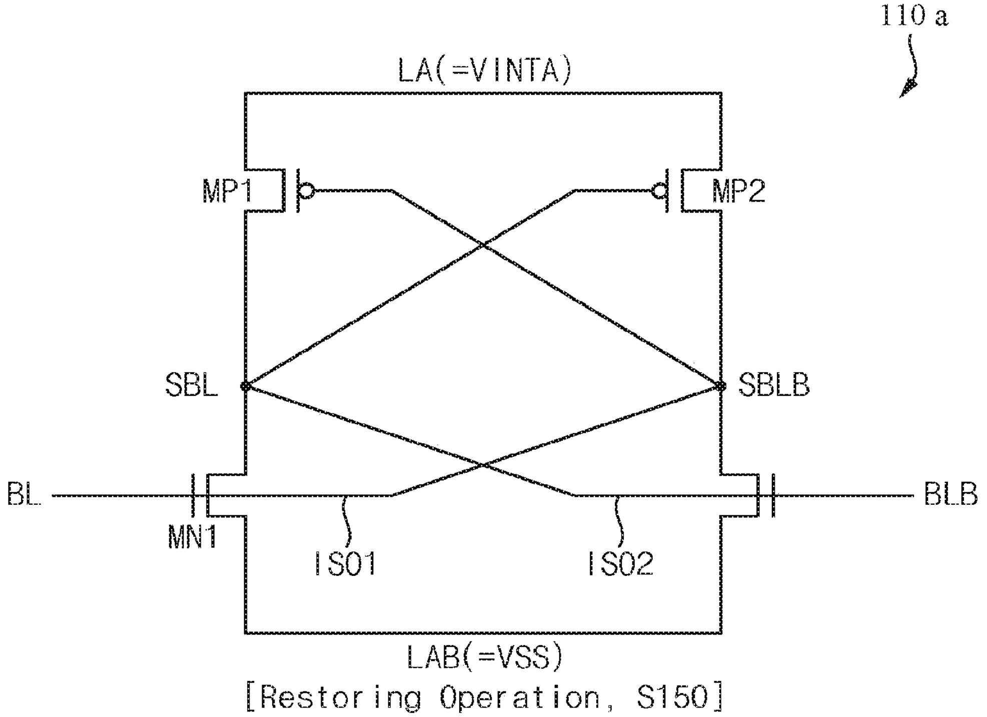

Referring to FIG. 12E, in operation S150 of FIG. 11, the bitline sense amplifier 110*a* may perform the restoring operation. For example, the offset cancellation signal P1 may have the logic low level (e.g., Low as shown in FIG. 13B), and the isolation signal P2 may have the logic high level (e.g., High as shown in FIG. 13B)

The first and second isolation transistors ISO1 and ISO2 may be turned on in response to the isolation signal P2 having the logic high level (e.g., High as shown in FIG. 13B), and the first and second offset cancellation transistors OC1 and OC2 may be turned off in response to the offset cancellation signal P1 having the logic low level (e.g., Low as shown in FIG. 13B). In this case, the bitline BL and the complementary sensing bitline SBLB may be connected by the first isolation transistor ISO1, and the complementary bitline BLB and the sensing bitline SBL may be connected by the second isolation transistor ISO2. Thus, the voltage of the bitline BL may increase or decrease to a voltage level of the complementary sensing bitline SBLB, and the voltage of the complementary bitline BLB may increase or decrease to a voltage level of the sensing bitline SBL.

In some example embodiments, after the pre-sensing operation, the sensing bitline pair SBL and SBLB of the bitline sense amplifier 110*a* may be connected to a data line, and data may be output to a local sense amplifier, a global sense amplifier, and/or a data I/O buffer (e.g., the data I/O buffer 295 in FIG. 14) through the data line.

As described above, the bitline sense amplifier 110*a* may compensate for the offset of the bitline sense amplifier 110*a* by the offset cancelling operation, may minimize the coupling between the bitlines BL by the pre-sensing operation, and thus an effective sensing margin thereof may be improved.

Referring to FIG. 13B, the bitline sense amplifier 110*a* may perform the precharging operation (S110), the offset cancelling operation (S120), the charge sharing operation (S130), the pre-sensing operation (S140), and the restoring operation (S150) based on the equalizing signal PEQ, the offset cancellation signal P1, the isolation signal P2, and the first and second control signals LA and LAB.

In FIG. 13B, an x-axis denotes time and a y-axis denotes a signal level (or voltage level, e.g., High or Low). For example, it is assumed that the memory cell stores data having a value of '1' and the threshold voltage of the first NMOS transistor MN1 is greater than the threshold voltage of the second NMOS transistor MN2 by an offset voltage Vos.

In a first time interval from t0 to t1, the bitline sense amplifier 110*a* may perform the precharging operation (S110). In this case, the equalizing signal PEQ, the offset cancellation signal P1, and the isolation signal P2 may have the logic high level (e.g., High), and the bitline pair BL and BLB and the sensing bitline pair SBL and SBLB may be precharged to the precharge voltage VBL. In addition, the first control signal LA and the second control signal LAB may be precharged to the precharge voltage VBL.

In a second time interval from t1 to t2, the bitline sense amplifier 110*a* may perform the offset cancelling operation (S120). In this case, the isolation signal P2 may have the logic low level (e.g., Low). The first control signal LA may increase from the precharge voltage VBL to the internal power supply voltage VINTA, and the second control signal LAB may decrease from the precharge voltage VBL to the ground voltage VSS. The bitline sense amplifier 110*a* may perform the above-described offset cancelling operation. Since the threshold voltage of the first NMOS transistor MN1 is greater than the threshold voltage of the second NMOS transistor MN2 by the offset voltage Vos, the voltage of the complementary bitline BLB may be greater than the voltage of bitline BL by the offset voltage Vos during the offset cancelling operation. Therefore, the voltages of the bitline BL and the complementary bitline BLB may have a difference by the offset voltage Vos, and thus the offset noise of the bitline sense amplifier 110*a* may be cancelled.

In a third time interval from t2 to t3, the bitline sense amplifier 110*a* may perform the charge sharing operation (S130). In this case, the offset cancellation signal P1 and the isolation signal ISO may have the logic low level (e.g., Low), the wordline (e.g., the wordline WLi) connected to the memory cell may be activated, and the charge sharing operation may be performed between the electric charges stored in the cell capacitor of the memory cell and the electric charges stored in the bitline. Since data having the value of '1' is stored in the memory cell, the voltage level of the bitline BL may increase by a predetermined level during the charge sharing operation.

In a fourth time interval from t3 to t4, the bitline sense amplifier 110*a* may perform the pre-sensing operation (S140). In this case, the first control signal LA may be transitioned from the precharge voltage VBL to the internal power supply voltage VINTA, and the second control signal LAB may be transitioned the precharge voltage VBL to the ground voltage VSS. Thus, in the bitline sense amplifier 110*a*, the voltage of the sensing bitline SBL may increase to the internal power supply voltage VINTA, and the voltage of the complementary sensing bitline SBLB may decrease to the ground voltage VSS, based on the voltage difference between the bitline BL and the complementary bitline BLB.

In a fifth time interval from t4 to t5, the bitline sense amplifier 110*a* may perform the restoring operation (S150). In this case, the isolation signal P2 may have the logic high level (e.g., High) and the offset cancellation signal P1 may remain to the logic low level (e.g., Low), and first and second isolation transistors ISO1 and ISO2 may be turned on. The bitline pair BL and BLB and the sensing bitline pair SBL and SBLB may be respectively connected to each other, and the bitline pair BL and BLB may be charged or discharged to the voltage level of the sensing bitline pair SBL and SBLB.

Figure 14:
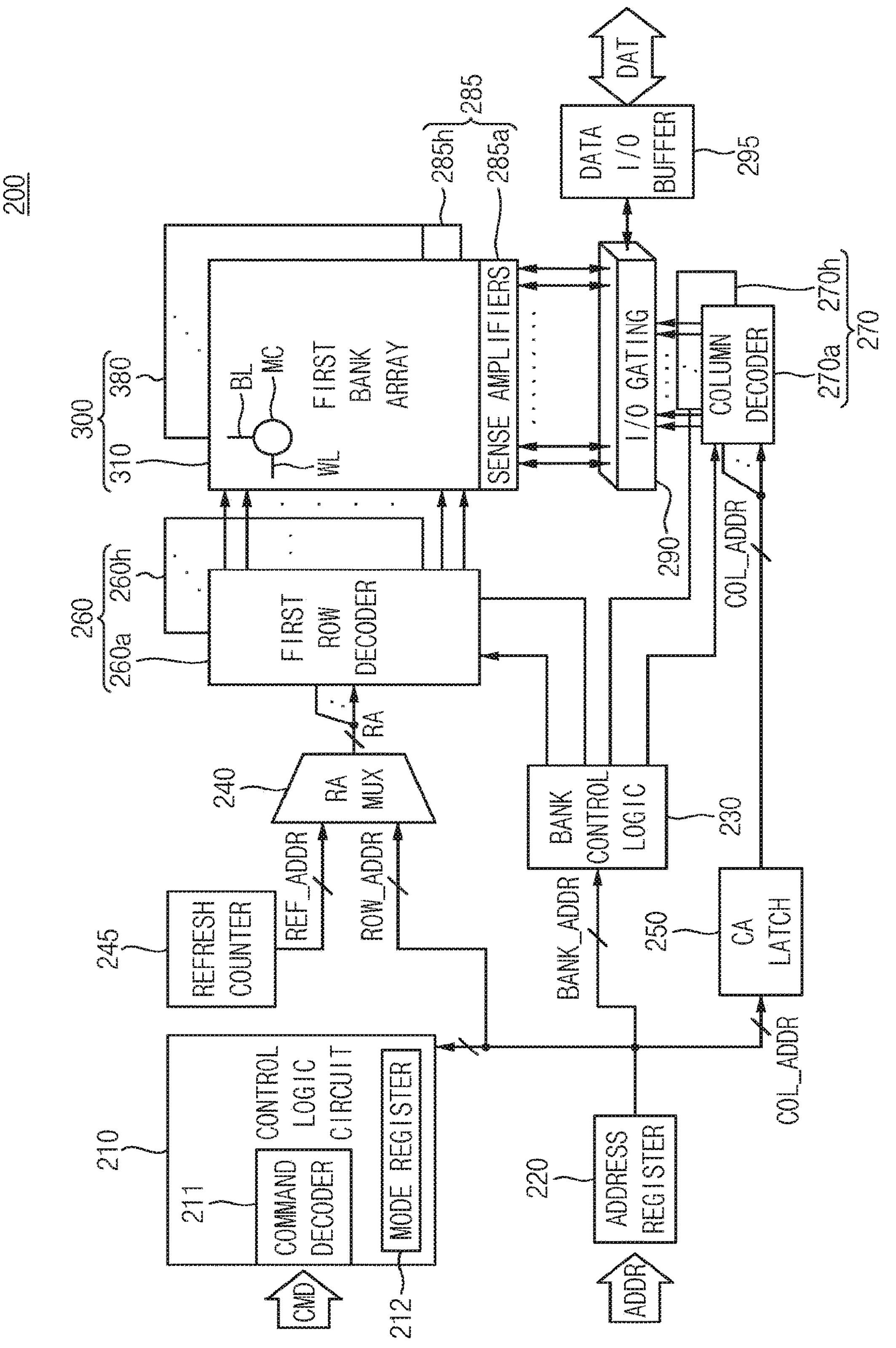
FIG. 14 is a block diagram illustrating a semiconductor memory device according to example embodiments.

FIG. 14 is a block diagram illustrating a semiconductor memory device according to example embodiments.

Referring to FIG. 14, a semiconductor memory device 200 may include a memory cell array 300, a control logic circuit 210, an address register 220, a bank control logic circuit 230, a row address multiplexer 240, a refresh counter 245, a column address latch 250, a row decoder 260, a column decoder 270, a sense amplifier circuit (or unit) 285, an input/output (I/O) gating circuit 290, and a data I/O buffer 295. For example, the semiconductor memory device 200 may be one of various volatile memory devices such as a dynamic random access memory (DRAM). In another example, the semiconductor memory device 200 may be any volatile memory device, and/or any nonvolatile memory device, e.g., a static random access memory (SRAM), a flash memory, a phase-change random access memory (PRAM), a resistive random access memory (RRAM), a magnetic random access memory (MRAM), a ferroelectric random access memory (FRAM), or the like.

The memory cell array 300 may include first to eighth bank arrays 310 to 380 (e.g., first to eighth bank arrays 310, 320, 330, 340, 350, 360, 370, and 380). The row decoder 260 may include first to eighth bank row decoders 260_a_ to 260_h_ connected to the first to eighth bank arrays 310 to 380, respectively. In this case, the first bank row decoder 260_a_ may be connected to the first bank array 310, and the eighth bank row decoder 260_h_ may be connected to the eighth bank array 380. The column decoder 270 may include first to eighth bank column decoders 270_a_ to 270_h_ connected to the first to eighth bank arrays 310 to 380 respectively. In this case, the first bank column 270_a_ may be connected to the first bank array 310, and the eighth bank column decoder 270_h_ may be connected to the eighth bank array 380. The sense amplifier circuit 285 may include first to eighth bank sense amplifiers 285_a_ to 285_h_ connected to the first to eighth bank arrays 310 to 380 respectively. In this case, the first bank sense amplifiers 285_a_ may be connected to the first bank array 310, and the eighth bank sense amplifiers 285_h_ may be connected to the eighth bank array 380.

The first to eighth bank arrays 310 to 380, the first to eighth bank row decoders 260_a_ to 260_h_, the first to eighth bank column decoders 270_a_ to 270_h_, and the first to eighth bank sense amplifiers 285_a_ to 285_h_ may form first to eighth banks, respectively. Each of the first to eighth bank arrays 310 to 380 may include a plurality of wordlines WL, a plurality of bitlines BL, and a plurality of memory cells MC intersected with the wordlines WL and the bitlines BL.

Although FIG. 14 illustrates the semiconductor memory device 200 including eight banks (and eight bank arrays, eight row decoders, and so on), the semiconductor memory device 200 may include any number of banks. In another example, the number of banks may be less than eight or more than eight. For example, the number of banks may be one, two, four, eight, sixteen, or thirty two banks, or any number therebetween one and thirty two.

Figure 16:
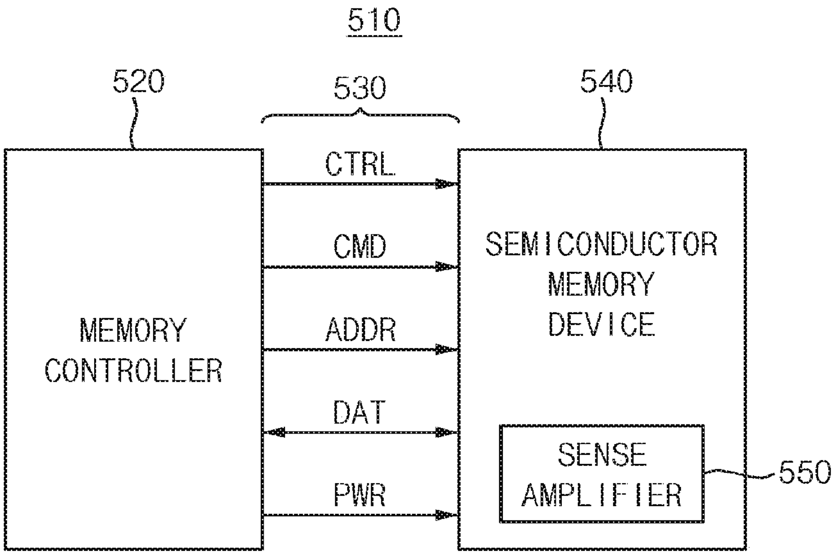
FIG. 16 is a block diagram illustrating a memory system according to example embodiments.

The address register 220 may receive the address ADDR including a bank address BANK_ADDR, a row address ROW_ADDR, and a column address COL_ADDR from a memory controller (e.g., a memory controller 520 in FIG. 16). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first to eighth bank row decoders 260_a_ to 260_h_ and one of the first to eighth bank column decoders 270_a_ to 270_h_ corresponding to the bank address BANK_ADDR may be activated in response to the bank control signals.

The row address multiplexer 240 may receive the row address ROW_ADDR from the address register 220 and a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first to eighth bank row decoders 260_a_ to 260_h_ respectively.

The activated one of the first to eighth bank row decoders 260_a_ to 260_h_ may decode the row address RA generated from the row address multiplexer 240, and may activate in the corresponding bank array a wordline WL corresponding to the row address RA. For example, the activated bank row decoder may generate a wordline driving voltage and may apply the wordline driving voltage to the wordline WL corresponding to the row address RA.

The column address latch 250 may receive the column address COL_ADDR from the address register 220 and may temporarily store the received column address COL_ADDR. In some example embodiments, in a burst mode, the column address latch 250 may generate column addresses that increment from the received column address COL_ADDR. The column address latch 250 may apply the temporarily stored or generated column address to the first to eighth bank column decoders 270_a_ to 270_h_ respectively.

The activated one of the first to eighth bank column decoders 270_a_ to 270_h_ may decode the column address COL_ADDR generated from the column address latch 250 and may control the I/O gating circuit 290 to output data corresponding to the column address COL_ADDR.

The I/O gating circuit 290 may include circuitry configured to gate input/output data. The I/O gating circuit 290 may further include read data latches configured to store data generated from the first to eighth bank arrays 310 to 380 and may also include write control devices for writing data to the first to eighth bank arrays 310 to 380 respectively.

Data DAT read from one of the first to eighth bank arrays 310 to 380 may be sensed by a sense amplifier connected to the one bank array from which the data DAT is to be read, and may be stored in the read data latches. The data DAT stored in the read data latches may be provided to the memory controller via the data I/O buffer 295. Data DAT to be written in one of the first to eighth bank arrays 310 to 380 may be provided to the I/O gating circuit 290 via the data I/O buffer 295 from the memory controller, and the I/O gating circuit 290 may write the data DAT in the one bank array through the write drivers.

The control logic circuit 210 may control operations of the semiconductor memory device 200. For example, the control logic circuit 210 may generate control signals for the semiconductor memory device 200 to perform the write operation and/or the read operation. The control logic circuit 210 may include a command decoder 211 and a mode register 212. In this case, the command decoder 211 may decode a command CMD received from the memory controller, and the mode register 212 may set an operation mode of the semiconductor memory device 200. In some example embodiments, operations described herein as being performed by the control logic circuit 210 may be performed by processing circuitry. For example, the command decoder 211 may generate the control signals corresponding to the command CMD by decoding a write enable signal, a row address strobe signal, a column address strobe signal, and a chip selection signal.

The sense amplifier circuit 285 may be the sense amplifier circuit according to example embodiments, and may include the plurality of bitline sense amplifiers with the separation structure in which some sources and/or some active regions of the equalizing transistors are separated. Accordingly, the defects in the sense amplifier circuit 285 may be prevented and the size of the sense amplifier circuit 285 may be reduced.

Figure 15:
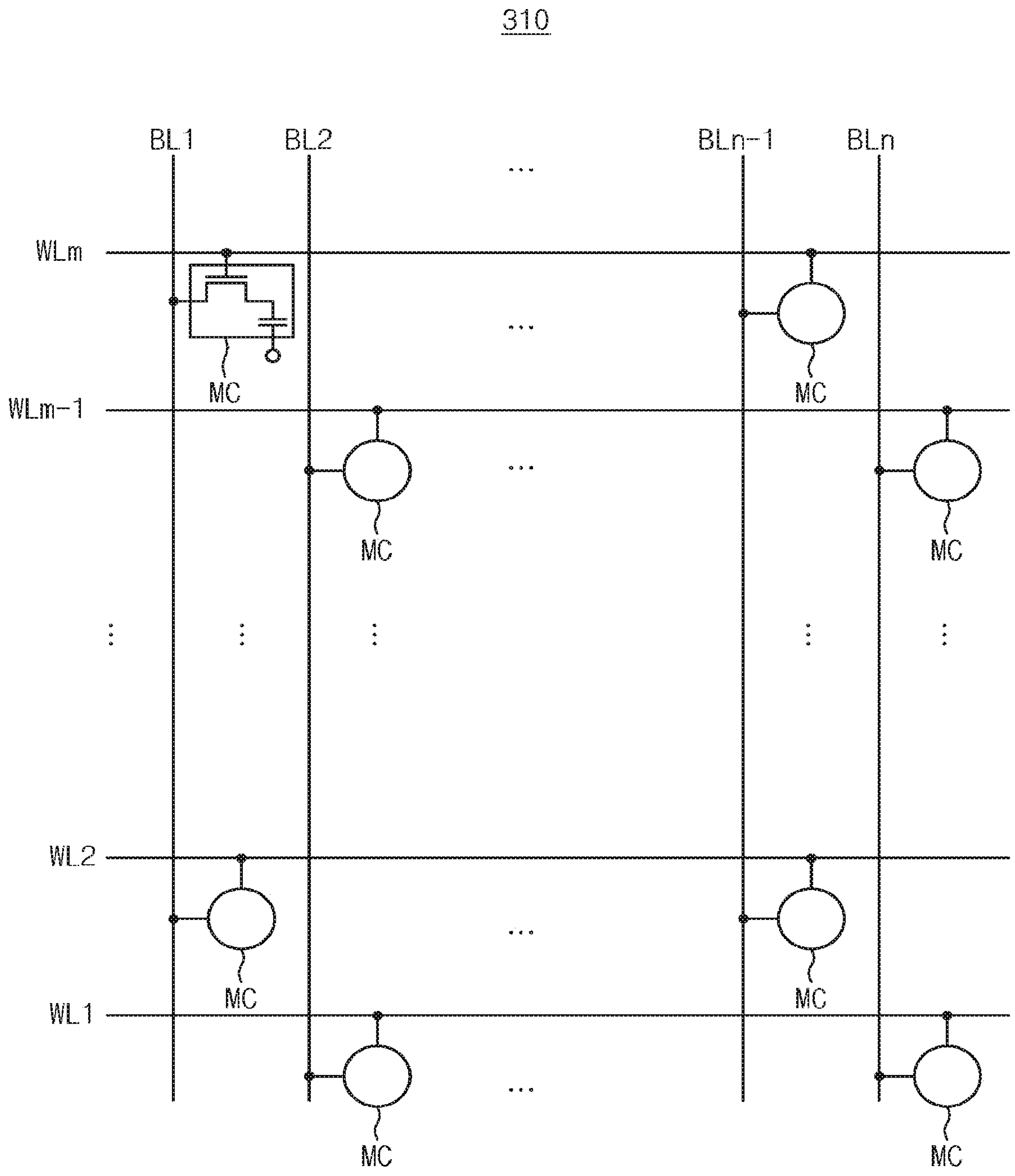
FIG. 15 is a diagram illustrating an example of a memory cell array included in a semiconductor memory device of FIG. 14.

FIG. 15 is a diagram illustrating an example of a memory cell array included in a semiconductor memory device of FIG. 14.

Referring to FIGS. 14 and 15, the first bank array 310 included in the memory cell array 300 may include a plurality of wordlines WL1, WL2, . . . , WLm−1, WLm (where m is a positive integer greater than or equal to two), a plurality of bitlines BL1, BL2, . . . , BLn−1, BLn (where n is a positive integer greater than or equal to two that may or may not be the same as m) crossing the plurality of wordlines WL1, WL2, . . . , WLm−1, WLm, and a plurality of memory cells MC arranged at or near intersections between the wordlines WL1 to WLm and the bitlines BL1 to BLn. For example, each of the plurality of memory cells MC may include a DRAM cell structure. The plurality of wordlines WL1 to WLm to which the plurality of memory cells MC are connected may be referred to as rows of the first bank array 310, and the plurality of bitlines BL1 to BLn to which the plurality of memory cells MC are connected may be referred to as columns of the first bank array 310. In this case, each of the plurality of memory cells MC may be connected to one of plurality of wordlines WL1 to WLm and one of the plurality of bitlines BL1 to BLn.

Although the semiconductor memory device according to example embodiments is described based on a DRAM, the semiconductor memory device according to example embodiments may be any volatile memory device, and/or any nonvolatile memory device, e.g., a static random access memory (SRAM), a flash memory, a phase-change random access memory (PRAM), a resistive random access memory (RRAM), a magnetic random access memory (MRAM), a ferroelectric random access memory (FRAM), or the like.

FIG. 16 is a block diagram illustrating a memory system according to example embodiments.

Referring to FIG. 16, a memory system 510 includes a memory controller 520 and a semiconductor memory device 540. The memory system 510 may further include a plurality of signal lines 530 that electrically connect the memory controller 520 to the semiconductor memory device 540.

The semiconductor memory device 540 is controlled by the memory controller 520. For example, based on requests from a host (not illustrated), the memory controller 520 may store (e.g., write or program) data into the semiconductor memory device 540, or may retrieve (e.g., read or sense) data from the semiconductor memory device 540.

The semiconductor memory device 540 may include a sense amplifier circuit 550. The sense amplifier circuit 550 may be the sense amplifier circuit according to example embodiments, and may include the plurality of bitline sense amplifiers with the separation structure in which some sources and/or some active regions of the equalizing transistors are separated. Accordingly, the defects in the sense amplifier circuit 550 may be prevented and the size of the sense amplifier circuit 550 may be reduced.

The plurality of signal lines 530 may include control lines to transmit a control signal CTRL, command lines to transmit a command CMD, address lines to transmit an address ADDR, data input/output (I/O) lines, and power lines to transmit a power supply voltage PWR. In this case, the memory controller 520 may transmit the command CMD, the address ADDR, and the control signal CTRL to the semiconductor memory device 540 via the command lines, the address lines, and the control lines, may exchange data DAT with the semiconductor memory device 540 via the data I/O lines, and may transmit the power supply voltage PWR to the semiconductor memory device 540 via the power lines. Although not illustrated in FIG. 16, the plurality of signal lines 530 may further include data strobe signal (DQS) lines to transmit a DQS signal.

Figure 17:
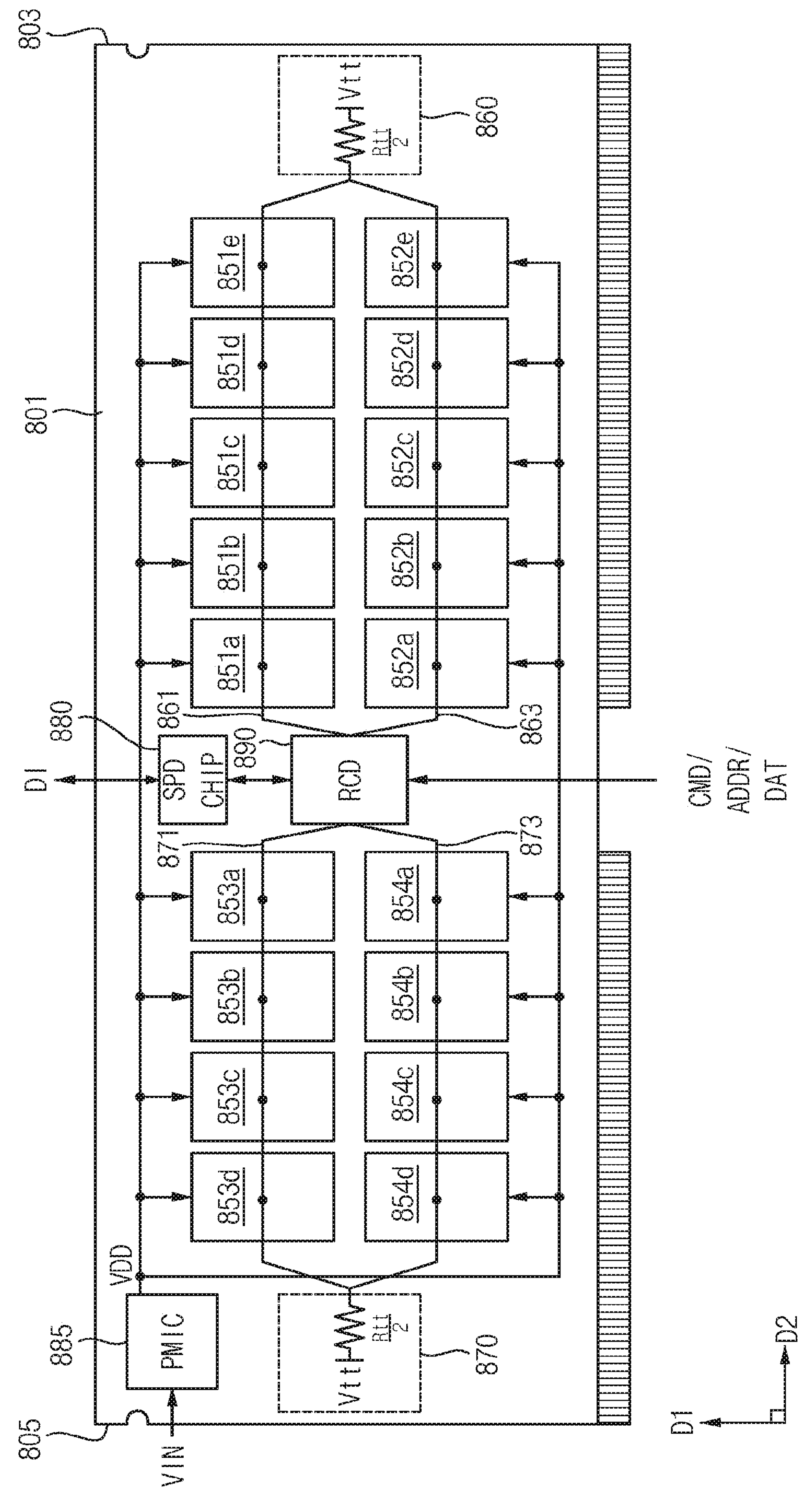
FIG. 17 is a block diagram illustrating an example of a memory module that may be employed to a memory system according to example embodiments.

FIG. 17 is a block diagram illustrating an example of a memory module that may be employed to a memory system according to example embodiments.

Referring to FIG. 17, a memory module 800 may include a buffer chip 890 (e.g., a registered clock driver; RCD) mounted on a circuit board 801, a plurality of semiconductor memory devices 851*a*, 851*b*, 851*c*, 851*d*, 851*e*, 852*a*, 852*a*, 852*c*, 852*d*, 852*e*, 853*a*, 853*b*, 853*c*, 853*d*, 854*a*, 854*b*, 854*c*, and 854*d*, module resistance units 860 and 870, a serial present detection (SPD) chip 880, and/or a power management integrated circuit (PMIC) 885.

The buffer chip 890 may control the semiconductor memory devices 851*a* to 851*e*, 852*a* to 852*e*, 853*a* to 853*d*, and 854*a* to 854*d* and the PMIC 885, by a memory controller (e.g., the memory controller 520 in FIG. 16). For example, the buffer chip 890 may receive a command CMD, an address ADDR, and data DAT from the memory controller to control the semiconductor memory devices 851*a* to 851*e*, 852*a* to 852*e*, 853*a* to 853*d*, and 854*a* to 854*d* and the PMIC 885.

The SPD chip 880 may be a programmable read only memory (PROM) (e.g., an electrically erasable PROM (EEPROM)). The SPD chip 880 may include initial information and/or device information DI of the memory module 800. In some example embodiments, the SPD chip 880 may include the initial information and/or the device information DI such as a module form, a module configuration, a storage capacity, a module type, an execution environment, and/or the like of the memory module 800.

When a memory system including the memory module 800 is booted up, the memory controller may read the device information DI from the SPD chip 880, and may recognize the memory module 800 based on the device information DI. The memory controller may control the memory module 800 based on the device information DI from the SPD chip 880. For example, the memory controller may recognize a type of the semiconductor memory devices 851*a* to 851*e*, 852*a* to 852*e*, 853*a* to 853*d*, and 854*a* to 854*d* included in the memory module 800 based on the device information DI from the SPD chip 880.

Here, the circuit board 801 which is a printed circuit board (PCB) may extend in a second direction D2 perpendicular to a first direction D1. The circuit board 801 may include a first edge portion 803 and a second edge portion 805. The first edge portion 803 and the second edge portion 805 may extend in the first direction D1. The buffer chip 890 may be disposed on a center of the circuit board 801. However, in another example, the buffer chip 890 may be disposed on any portion of the circuit board 801. The plurality of semiconductor memory devices 851*a* to 851*e*, 852*a* to 852*e*, 853*a* to 853*d*, and 854*a* to 854*d* may be arranged in a plurality of rows between the buffer chip 890 and the first edge portion 803, and between the buffer chip 890 and the second edge portion 805. In some example embodiments, operations described herein as being performed by the buffer chip 890 may be performed by processing circuitry.

In this example, the semiconductor memory devices 851*a* to 851*e* and 852*a* to 852*e* may be arranged along a plurality of rows between the buffer chip 890 and the first edge portion 803. The semiconductor memory devices 853*a* to 853*d* and 854*a* to 854*d* may be arranged along a plurality of rows between the buffer chip 890 and the second edge portion 805. In this case, the plurality of semiconductor memory devices 851*a* to 851*e* and 852*a* to 852*e* may be disposed between the first edge portion 803 and the buffer chip 890. In addition, the plurality of semiconductor memory devices 853*a* to 853*d* and 854*a* to 854*d* may be disposed between the second edge portion 805 and the buffer chip 890. For example, the semiconductor memory devices 851*a* to 851*d*, 852*a* to 852*d*, 853*a* to 853*d* and 854*a* to 854*d* may be data chips storing normal data, and the semiconductor memory devices 851e and 852e may be as parity chips storing parity data or error correction code (ECC) data.

The buffer chip 890 may provide a command/address signal (e.g., CA) to the semiconductor memory devices 851a to 851e through a command/address transmission line 861, and may provide a command/address signal to the semiconductor memory devices 852a to 852e through a command/address transmission line 863. In addition, the buffer chip 890 may provide a command/address signal to the semiconductor memory devices 853a to 853d through a command/address transmission line 871, and may provide a command/address signal to the semiconductor memory devices 854a to 854d through a command/address transmission line 873.

The command/address transmission lines 861 and 863 may be connected in common to the module resistance unit 860 disposed to be adjacent to the first edge portion 803, and the command/address transmission lines 871 and 873 may be connected in common to the module resistance unit 870 disposed to be adjacent to the second edge portion 805. In this case, one end of the command/address transmission lines 861 and 863 may be connected to the buffer chip 890, and the other end of the command/address transmission lines 861 and 863 may be connected to the module resistance unit 860. Similarity, one end of the command/address transmission lines 871 and 873 may be connected to the buffer chip 890, and the other end of the command/address transmission lines 871 and 873 may be connected to the module resistance unit 870. Each of the module resistance units 860 and 870 may include a termination resistor Rtt/2 connected to a termination voltage Vtt.

The SPD chip 880 may be disposed to be adjacent to the buffer chip 890, and the PMIC 885 may be disposed between the semiconductor memory device 853d and the second edge portion 805. In another example, the PMIC 885 may be disposed on any portion of the circuit board 801. The PMIC 885 may generate a power supply voltage VDD based on an input voltage VIN from an external source, and may provide a power supply voltage VDD to the semiconductor memory devices 851a to 851e, 852a to 852e, 853a to 853d, and 854a to 854d.

In some example embodiments, each of the semiconductor memory devices 851a to 851e, 852a to 852e, 853a to 853d, and 854a to 854d may be a DRAM device, and may include the sense amplifier circuit according to example embodiments.

Figure 18:
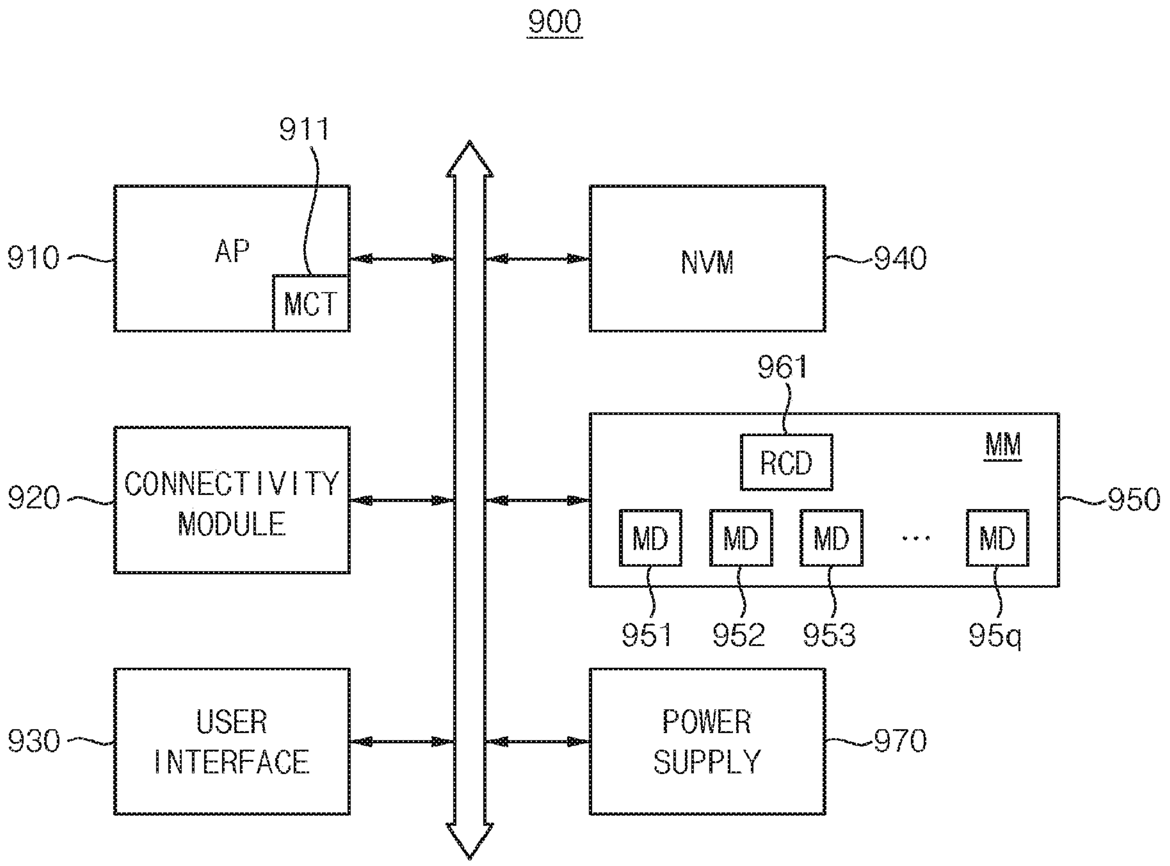
FIG. 18 is a block diagram illustrating an electronic system including a memory module according to example embodiments.

FIG. 18 is a block diagram illustrating an electronic system including a memory module according to example embodiments.

Referring to FIG. 18, an electronic system 900 includes an application processor (AP) 910, a connectivity module 920, a user interface 930, a nonvolatile memory device (NVM) 940, a memory module (MM), and/or a power supply 970. In this case, the memory module (MM) may include a dual in-line memory module (DIMM). For example, the electronic system 900 may be a mobile system.

The application processor 910 may include a memory controller 911. The application processor 910 may execute applications such as at least one of a web browser, a game application, a video player, etc. The connectivity module 920 may perform wired and/or wireless communication with an external device.

The memory module 950 may store data processed by the application processor 910 and/or operate as a working memory. The memory module 950 may include a plurality of semiconductor memory devices (MD) 951, 952, 953, . . . , 95q (where q is a positive integer greater than three), and/or a buffer chip (RCD) 961. The memory module 950 may be the memory module 800 of FIG. 17.

In some example embodiments, each of the semiconductor memory devices 951 to 95q may be a DRAM device, and may include the sense amplifier circuit according to example embodiments.

The nonvolatile memory device 940 may store a boot image for booting the electronic system 900. The user interface 930 may include at least one input device, such as a keypad, a touch screen, a touch pen, and at least one output device, such as a speaker, a display device, etc. The power supply 970 may supply an operating voltage to the electronic system 900.

The electronic system 900 or components of the electronic system 900 may be mounted using various types of packages.

The example embodiments may be applied to various electronic devices and systems that include the semiconductor memory devices. For example, the example embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an automotive, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A sense amplifier circuit comprising:

a plurality of bitline sense amplifiers, wherein the plurality of bitline sense amplifiers include a first group of bitline sense amplifiers and a second group of bitline sense amplifiers, wherein sources of first equalizing transistors included in the first group of bitline sense amplifiers are connected to each other, wherein sources of second equalizing transistors included in the second group of bitline sense amplifiers are connected to each other, wherein the sources of the first equalizing transistors and the sources of the second equalizing transistors are separated from each other, wherein each of the plurality of bitline sense amplifiers includes:

an amplifying circuit electrically connected to a bitline and a complementary bitline, the amplifying circuit configured to sense a voltage difference between the bitline and the complementary bitline and to adjust a voltage of a sensing bitline and a complementary sensing bitline based on the voltage difference;

an isolation circuit configured to electrically connect the bitline and the complementary bitline with the complementary sensing bitline and the sensing bitline, respectively;

an offset cancellation circuit configured to electrically connect the bitline and the complementary bitline to the sensing bitline and the complementary sensing bitline, respectively;

an equalizer circuit configured to equalize the bitline and the complementary bitline to a precharge voltage;

a first active region corresponding to the sources of the first equalizing transistors;

a first direct contact disposed on the first active region;

a first bitline metal pattern disposed on the first direct contact;

a second direct contact disposed on the first bitline metal pattern; and a second bitline metal pattern disposed on the second direct contact, wherein the equalizer circuit includes an equalizing transistor that has a source connected to the precharge voltage, a gate configured to receive an equalizing signal, and a drain, wherein an active region is formed such that sources of equalizing transistors of a first bitline sense amplifier and a second bitline sense amplifier are connected to each other and sources of equalizing transistors of the first bitline sense amplifier and a third bitline sense amplifier are separated from each other, and wherein the precharge voltage is provided to the active region through the first direct contact, the second direct contact, the first bitline metal pattern, and the second bitline metal pattern.

2. The sense amplifier circuit of claim 1, wherein the first group of bitline sense amplifiers include the first bitline sense amplifier and the second bitline sense amplifier that are disposed adjacent to each other.

3. The sense amplifier circuit of claim 2, wherein the first group of bitline sense amplifiers further include fourth and fifth bitline sense that are disposed adjacent to each other, and wherein the fourth and fifth bitline sense amplifiers are spaced apart from the first bitline sense amplifier and the second bitline sense amplifier.

4. The sense amplifier circuit of claim 1, further comprising:

a second active region corresponding to the sources of the second equalizing transistors;

a third direct contact disposed on the second active region;

a third bitline metal pattern disposed on the third direct contact; and a fourth direct contact disposed on the third bitline metal pattern, wherein the second bitline metal pattern extends to be disposed on the fourth direct contact.

5. The sense amplifier circuit of claim 4, further comprising:

an active cut region between the first active region and the second active region.

6. The sense amplifier circuit of claim 4, wherein the precharge voltage is provided to the second active region through the third direct contact and the fourth direct contact and the second bitline metal pattern and the third bitline metal pattern.

7. The sense amplifier circuit of claim 1, further comprising:

a conductive pattern configured to transmit the precharge voltage, and wherein the first direct contact is connected to the first active region by penetrating the conductive pattern.

8. The sense amplifier circuit of claim 1, wherein the equalizer circuit is connected between the precharge voltage and the complementary sensing bitline.

9. The sense amplifier circuit of claim 1, wherein the equalizer circuit is connected between the precharge voltage and the sensing bitline.

10. The sense amplifier circuit of claim 1, wherein the amplifying circuit includes:

a first p-type metal oxide semiconductor (PMOS) transistor connected between a control line and the sensing bitline, and including a gate connected to the complementary sensing bitline;

a second PMOS transistor connected between the control line and the complementary sensing bitline, and including a gate connected to the sensing bitline;

a first n-type metal oxide semiconductor (NMOS) transistor connected between a complementary control line and the sensing bitline, and including a gate connected to the bitline; and a second NMOS transistor connected between the complementary control line and the complementary sensing bitline, and including a gate connected to the complementary bitline.

11. The sense amplifier circuit of claim 10, wherein the isolation circuit includes:

a first isolation transistor connected between the bitline and the complementary sensing bitline, and including a gate configured to receive an isolation signal; and a second isolation transistor connected between the complementary bitline and the sensing bitline, and including a gate configured to receive the isolation signal.

12. The sense amplifier circuit of claim 11, wherein the offset cancellation circuit includes:

a first offset cancellation transistor connected between the bitline and the sensing bitline, and including a gate configured to receive an offset cancellation signal; and a second offset cancellation transistor connected between the complementary bitline and the complementary sensing bitline, and including a gate configured to receive the offset cancellation signal.

13. The sense amplifier circuit of claim 12, further comprising:

a first active region disposed in a first region, the first active region having a rectangular shape with long sides parallel to a first direction and short sides parallel to a second direction crossing the first direction in a plan view;

a second active region and a third active region disposed in the first region and a second region adjacent to the first region, each of the second active region and the third active region having a rectangular shape with long sides parallel to the second direction and long sides parallel to the first direction in the plan view, the second active region and the third active region being adjacent to the first active region and spaced apart from each other along the first direction;

a fourth active region disposed in a third region adjacent to the second region, and paced apart from the second active region and the third active region along the second direction;

a first gate pattern extending along the first direction on the second active region and the third active region in the first region;

a second gate pattern and a third gate pattern extending along the first direction on the second active region and the third active region in the second region, the second gate pattern and the third gate pattern being spaced apart from each other along the second direction; and a fourth gate pattern and a fifth gate pattern extending along the second direction on the fourth active region in the third region, the fourth and fifth gate patterns being spaced apart from each other along the first direction.

14. The sense amplifier circuit of claim 13, wherein the first, second, and third active regions in the first region and the first gate pattern in the first region correspond to the equalizing transistor, and the first gate pattern is configured to receive the equalizing signal, wherein the second active region and the third active region in the second region and the second gate pattern in the second region correspond to one of the first offset cancellation transistor and the second offset cancellation transistor, and the second gate pattern is configured to receive the offset cancellation signal, wherein the second active region and the third active region in the second region and the third gate pattern in the second region correspond to one of the first isolation transistor and the second isolation transistor, and the third gate pattern is configured to receive the isolation signal, and wherein the fourth active region in the third region and the fourth and fifth gate patterns in the third region correspond to one of the first NMOS transistor and second NMOS transistor.

15. A semiconductor memory device comprising:

a memory cell array including a plurality of memory cells; and a sense amplifier circuit including a plurality of bitline sense amplifiers connected to the plurality of memory cells, wherein the plurality of bitline sense amplifiers include a first group of bitline sense amplifiers and a second group of bitline sense amplifiers, wherein sources of first equalizing transistors included in the first group of bitline sense amplifiers are connected to each other, wherein sources of second equalizing transistors included in the second group of bitline sense amplifiers are connected to each other, wherein the sources of the first equalizing transistors and the sources of the second equalizing transistors are separated from each other, wherein each of the plurality of bitline sense amplifiers includes:

an amplifying circuit electrically connected to a bitline and a complementary bitline, the amplifying circuit configured to sense a voltage difference between the bitline and the complementary bitline and to adjust a voltage of a sensing bitline and a complementary sensing bitline based on the voltage difference;

an isolation circuit configured to electrically connect the bitline and the complementary bitline with the complementary sensing bitline and the sensing bitline, respectively;

an offset cancellation circuit configured to electrically connect the bitline and the complementary bitline to the sensing bitline and the complementary sensing bitline, respectively;

an equalizer circuit configured to equalize the bitline and the complementary bitline to a precharge voltage;

a first active region corresponding to the sources of the first equalizing transistors;

a first direct contact disposed on the first active region;

a first bitline metal pattern disposed on the first direct contact;

a second direct contact disposed on the first bitline metal pattern; and a second bitline metal pattern disposed on the second direct contact, wherein the equalizer circuit includes an equalizing transistor that has a source connected to the precharge voltage, a gate configured to receive an equalizing signal, and a drain, wherein an active region is formed such that sources of equalizing transistors of a first bitline sense amplifier and a second bitline sense amplifier are connected to each other and sources of equalizing transistors of the first bitline sense amplifier and a third bitline sense amplifier are separated from each other, and wherein the precharge voltage is provided to the active region through the first direct contact, the second direct contact, the first bitline metal pattern, and the second bitline metal pattern.

16. The semiconductor memory device of claim 15, wherein the semiconductor memory device is a dynamic random access memory (DRAM).

17. A sense amplifier circuit comprising:

a plurality of bitline sense amplifiers, wherein the plurality of bitline sense amplifiers include a first group of bitline sense amplifiers and a second group of bitline sense amplifiers, wherein sources of first equalizing transistors included in the first group of bitline sense amplifiers are connected to each other, wherein sources of second equalizing transistors included in the second group of bitline sense amplifiers are connected to each other, wherein the sources of the first equalizing transistors and the sources of the second equalizing transistors are separated from each other, wherein each of the plurality of bitline sense amplifiers includes:

an amplifying circuit electrically connected to a bitline and a complementary bitline, the amplifying circuit configured to sense a voltage difference between the bitline and the complementary bitline based on a first control signal and a second control signal, and to adjust a voltage of a sensing bitline and a complementary sensing bitline based on the voltage difference;

an isolation circuit configured to electrically connect the bitline and the complementary bitline with the complementary sensing bitline and the sensing bitline, respectively, based on an isolation signal;

an offset cancellation circuit configured to electrically connect the bitline and the complementary bitline to the sensing bitline and the complementary sensing bitline, respectively, based on an offset cancellation signal;

an equalizer circuit electrically connected to the complementary sensing bitline, the equalizer circuit configured to equalize the bitline and the complementary bitline to a precharge voltage;

a first active region corresponding to the sources of the first equalizing transistors;

a first direct contact disposed on the first active region;

a first bitline metal pattern disposed on the first direct contact;

a second direct contact disposed on the first bitline metal pattern; and a second bitline metal pattern disposed on the second direct contact, wherein the equalizer circuit includes an equalizing transistor that has a source connected to the precharge voltage, a gate configured to receive an equalizing signal, and a drain electrically connected to the complementary sensing bitline, wherein sources of first and second equalizing transistors included in first and second bitline sense amplifiers that are adjacent to each other are connected to each other, and a first active region corresponding to the sources of the first and second equalizing transistors is integrally formed, wherein sources of third and fourth equalizing transistors included in third and fourth bitline sense amplifiers that are adjacent to each other and spaced apart from the first and second bitline sense amplifiers are connected to each other, and a second active region corresponding to the sources of the third and fourth equalizing transistors is integrally formed, wherein the sources of the first and second equalizing transistors and the sources of the third and fourth equalizing transistors are separated from each other, and an active cut region is formed between the first active region and the second active region to separate the first active region from the second active region, and wherein the precharge voltage is provided to the active region through the first direct contact, the second direct contact, the first bitline metal pattern, and the second bitline metal pattern.

* * * * *